(12) United States Patent
Takahashi

(10) Patent No.: US 8,685,763 B2
(45) Date of Patent: Apr. 1, 2014

(54) METHOD OF MANUFACTURING NOZZLE PLATE

(71) Applicant: Fujifilm Corporation, Tokyo (JP)

(72) Inventor: Shuji Takahashi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/802,603

(22) Filed: Mar. 13, 2013

(65) Prior Publication Data

US 2013/0244352 A1   Sep. 19, 2013

(30) Foreign Application Priority Data

Mar. 14, 2012   (JP) .................................. 2012-057638

(51) Int. Cl.
*H01L 21/00* (2006.01)
*B41J 2/14* (2006.01)
*B41J 2/16* (2006.01)
*G01D 15/00* (2006.01)
*G11B 5/127* (2006.01)

(52) U.S. Cl.
USPC .................................. 438/21; 347/47; 216/27

(58) Field of Classification Search
None
See application file for complete search history.

(56) References Cited

U.S. PATENT DOCUMENTS 5,308,442 A * 5/1994 Taub et al. ...................... 216/27
5,589,083 A   12/1996 Ahn et al.
2006/0028508 A1 * 2/2006 Chen et al. ...................... 347/47
2008/0186356 A1 * 8/2008 Takahashi ....................... 347/45
2010/0165048 A1 * 7/2010 DeBrabander et al. ......... 347/47

FOREIGN PATENT DOCUMENTS

| JP | 07-201806 A | 8/1995 |
| JP | H09-216360 A | 8/1997 |
| JP | 2008-049673 A | 3/2008 |

OTHER PUBLICATIONS

An Office Action; "Notification of Reasons for Rejection," issued by the Japanese Patent Office on Jan. 29, 2014, which corresponds to Japanese Patent Application No. 2012-057638 and is related to U.S. Appl. No. 13/802,603; with a partial English language translation.

* cited by examiner

*Primary Examiner* — Andres Munoz
(74) *Attorney, Agent, or Firm* — Studebaker & Brackett PC

(57) ABSTRACT

A method of manufacturing a nozzle plate includes: a mask pattern layer forming step of, with respect to a laminated substrate constituted of a first silicon substrate having a (111) surface orientation and a second silicon substrate having a (100) surface orientation, forming a frame-shaped mask pattern layer on the second silicon substrate; a non-through hole forming step of forming a straight section of the nozzle in the first silicon substrate; a protective film forming step of forming a protective film over a first portion on the second silicon substrate that is not covered with the mask pattern layer, and over inner surfaces of the first and second silicon substrates defining the non-through hole; and an anisotropic etching step of anisotropically etching the second silicon substrate so as to form a tapered section of the nozzle defined with {111} surfaces exposed in the second silicon substrate by the anisotropic etching.

17 Claims, 28 Drawing Sheets

METHOD OF MANUFACTURING NOZZLE PLATE

BACKGROUND OF THE INVENTION

1. Field of the Invention

The present invention relates to a method of manufacturing a nozzle plate including nozzles each having straight sections and tapered sections.

2. Description of the Related Art

In general, an inkjet head of an inkjet recording apparatus includes a nozzle plate, in which nozzles (also referred to as "nozzle apertures") are formed. The inkjet head performs recording onto a recording medium by ejecting droplets of ink respectively from the nozzles connected to pressure chambers by applying pressure to the ink inside the pressure chambers by using ejection energy applied by piezoelectric elements, heating elements, or the like, so as to deposit the ink droplets onto the recording medium.

A commonly known nozzle plate (also referred to as a "nozzle forming substrate") is formed with nozzles, each of which has a nozzle opening in a surface (referred to as a "nozzle face") of the nozzle plate, a straight section formed vertically extending from the nozzle opening perpendicularly to the nozzle face, and a tapered section substantially having a funnel shape, which is formed on an opposite side of the straight section from the nozzle opening and has a surface oblique to the straight section. Since a substantially right-angled step section is not present between the straight section and the tapered section, then even if the ink contains bubbles, the bubbles do not remain in the step section, and hence decline in the ejection performance is prevented. By this means, it is possible to achieve smooth ejection of ink droplets.

A nozzle plate of this kind is formed by a laminated substrate forming step, an etching window forming step, a first etching step and a second etching step, as described in Japanese Patent Application Publication No. 07-201806 (FIGS. 29 to 31), for example. In the laminated substrate forming step, a laminated substrate is formed by bonding a silicon substrate that has both planar surfaces along (100) crystal planes (hereinafter referred to as the "(100) substrate") on a silicon substrate that has both planar surfaces along (110) crystal planes (hereinafter referred to as the "(110) substrate"). In the etching window forming step, etching windows are formed in the (100) substrate at positions where nozzles are to be formed. The region apart from the positions where the nozzles are to be formed is covered with a mask.

In the first etching step, anisotropic etching of the (100) substrate is carried out through the etching windows to form recesses in the (100) substrate. Each of the etched recesses has side surfaces, which are {111} surfaces exposed in the (100) substrate, and a quadrilateral bottom surface, which is an exposed upper surface of the (110) substrate (hereinafter referred to as the "quadrilateral upper surface of the (110) substrate"). Thereby, the etched recesses gradually narrowing from the (100) substrate toward the (110) substrate are formed. A tapered section of each of the nozzles is formed substantially in a quadrilateral pyramid shape in the (100) substrate, by the {111} surfaces defining each of the etched recesses in the (100) substrate.

In the second etching step, the (110) substrate is anisotropically etched from the quadrilateral upper faces of the (110) substrate, which have been exposed by the anisotropic etching in the first etching step. By the anisotropic etching in the second etching step, the (110) substrate is formed with quadrilateral holes. Each of the quadrilateral holes has side surfaces, which are {111} surfaces exposed in the (110) substrate by the anisotropic etching. Thereby, a straight section of each of the nozzles is formed in a quadrilateral hole shape in the (110) substrate and connected to the tapered section.

The tapered section and the straight section are thus formed coaxially by forming the straight section by etching the (110) substrate through the etched recess formed in the (100) substrate, in other words, by defining the positions of the tapered section and the straight section of the nozzle by a single photolithography process (i.e., the etching window forming step). As a result of this, positional deviation between the tapered section and the straight section is prevented.

Furthermore, since the tapered section and the straight section are respectively formed in the two substrates having the different crystal orientations, then by adjusting the thicknesses of the two substrates, it is possible to specify the lengths of the tapered section and the straight section (the lengths in the thickness direction of the nozzle plate). Consequently, the lengths of the tapered section and the straight section can be managed with high precision.

SUMMARY OF THE INVENTION

In the method of manufacturing a nozzle plate described in Japanese Patent Application Publication No. 07-201806, by forming a straight section and a tapered section respectively in two substrates having different surface orientations, it becomes possible to prevent positional deviation between the tapered section and the straight section, as well as achieving highly precise management of the lengths of the tapered section and the straight section. However, in this method, even if the size of the etching window is the same, the size of the quadrilateral upper face of the (110) substrate that is exposed by the first etching step varies depending on the thickness of the (100) substrate, and therefore the hole diameter of the straight section of the nozzle also varies (see paragraph 110 in Japanese Patent Application Publication No. 07-201806). Consequently, the hole diameter of the straight section is specified by a total of two parameters: the size of the etching window and the thickness of the (100) substrate. Although the size of the etching window and the thickness of the (100) substrate are respectively managed with high precision, if a plurality of parameters are involved, then there are limits on the extent to which the straight section (the size of the opening thereof) can be formed with high precision.

Furthermore, if the laminated substrate is the two-layered substrate composed of the (100) substrate and the (110) substrate, then the thickness of the laminated substrate is thin, and hence handling properties are poor and there is a risk of breakage of the substrate. Moreover, since the straight section is formed in the (111) substrate, the straight section is limited to having the quadrilateral hole shape. If the straight section has the quadrilateral hole shape, then during ejection of droplets of the ink, the flow rate of the ink differs between the corner portions and the other portions of the quadrilateral shape, and this is undesirable in that it can cause adherence of dirt and solidification of the ink.

It is an object of the present invention to provide a method of manufacturing a nozzle plate whereby, when forming a straight section and a tapered section of a nozzle in silicon substrates having different surface orientations, respectively, the straight section can be formed with high precision, breaking of the laminated substrates can be prevented, and the hole shape of the straight section can be adjusted.

In order to attain the aforementioned object, the present invention is directed to a method of manufacturing a nozzle plate, comprising: a mask pattern layer forming step of, with respect to a laminated substrate having a structure in which a first silicon substrate having a (111) surface orientation and a second silicon substrate having a (100) surface orientation are sequentially laminated on a surface of an oxide film, forming a frame-shaped mask pattern layer on the second silicon substrate, the frame-shaped mask pattern layer having a first opening section at a position where a nozzle is to be formed; a non-through hole forming step of forming a straight section of the nozzle in the first silicon substrate by forming a non-through hole that passes from the first opening section through the second silicon substrate and the first silicon substrate to the surface of the oxide film; a protective film forming step of forming a protective film over a first portion on the second silicon substrate that is not covered with the mask pattern layer, and over inner surfaces of the first and second silicon substrates defining the non-through hole; a mask pattern layer removal step of removing the mask pattern layer from the second silicon substrate and exposing a second portion on the second silicon substrate that has been covered with the mask pattern layer; an anisotropic etching step of performing anisotropic etching of the second silicon substrate from the second portion until reaching the first silicon substrate using the protective film as a mask, so as to form a tapered section of the nozzle, the tapered section being defined with {111} surfaces exposed in the second silicon substrate by the anisotropic etching, the tapered section being connected with the straight section and gradually narrowing toward the straight section; a protective film removal step of removing the protective film; and an opening exposure step of exposing an opening of the straight section at a side of the first silicon substrate adjacent to the oxide film.

According to this aspect of the present invention, when forming the straight section and the tapered section of the nozzle in the first silicon substrate and the second silicon substrate, respectively, the hole diameter of the straight section is specified in accordance with a single parameter (the first opening section).

Preferably, in the mask pattern layer forming step, the first opening section is formed in a circular shape; and in the non-through hole forming step, the straight section is formed in a circular hole shape by forming the non-through hole in a circular hole shape.

Preferably, in the mask pattern layer forming step, an outer shape of the mask pattern layer is formed in a quadrilateral shape.

Preferably, a length of the straight section is specified by adjusting a thickness of the first silicon substrate.

Preferably, a length of the tapered section is specified by adjusting a thickness of the second silicon substrate.

Preferably, in the anisotropic etching step, the first silicon substrate functions as an etching stopper in the anisotropic etching of the second silicon substrate.

Preferably, the mask pattern layer forming step includes: a mask layer forming step of forming a mask layer over the second silicon substrate; a first resist pattern layer forming step of forming, over the mask layer, a first resist pattern layer of a shape corresponding to the mask pattern layer at a position corresponding to the position where the nozzle is to be formed; a mask layer etching step of forming the mask pattern layer by etching the mask layer using the first resist pattern layer as a mask; and a first resist pattern layer removal step of removing the first resist pattern layer.

Preferably, the non-through hole forming step includes: a second resist pattern layer forming step of forming, over the second silicon substrate and the mask pattern layer, a second resist pattern layer having a second opening section which exposes the first opening section; a silicon substrate etching step of forming the non-through hole by sequentially etching the second silicon substrate and the first silicon substrate by using the second resist pattern layer as a mask; and a second resist pattern layer removal step of removing the second resist pattern layer.

Preferably, the mask pattern layer is made from a material having resistance to thermal oxidization; and in the protective film forming step, a thermal oxide film as the protective film is formed on the first portion of the second silicon substrate and on the inner surfaces of the first and second silicon substrates defining the non-through hole.

Preferably, in the opening exposure step, the opening of the straight section at the side of the first silicon substrate adjacent to the oxide film is exposed by removing the oxide film.

Preferably, the protective film forming step includes: a whole surface protective film forming step of forming the protective film over the first portion of the second silicon substrate, over the mask pattern layer, and over an inner surface of the non-through hole; a third resist pattern layer forming step of forming a third resist pattern layer which covers the protective film formed on the first portion of the second silicon substrate; and a protective film etching step of etching and removing the protective film formed on the mask pattern layer and the protective film formed on a bottom section of the non-through hole, by using the third resist pattern layer as a mask.

Preferably, a third silicon substrate having a (110) surface orientation is arranged on another surface of the oxide film; and in the mask pattern layer removal step, a third opening section which is coaxial with the non-through hole is formed in the oxide film by etching the oxide film via the non-through hole, so as to expose a portion of a first surface of the third silicon substrate adjacent to the oxide film.

Preferably, in the anisotropic etching step, a counterbore is formed in the first surface of the third silicon substrate, by performing the anisotropic etching of the third silicon substrate from a portion of the first surface toward a second surface of the third silicon substrate reverse to the first surface, via the non-through hole and the third opening section.

Preferably, in the opening exposure step, the counterbore is exposed by polishing or grinding the third silicon substrate from the second surface.

Preferably, the laminated substrate includes an SOI substrate in which the oxide film and the first silicon substrate are laminated sequentially on a third silicon substrate having a (110) surface orientation, and the second silicon substrate which is laminated on the first silicon substrate.

Preferably, the laminated substrate includes an SOI substrate in which the oxide film and the first silicon substrate are laminated sequentially on a third silicon substrate, and the second silicon substrate which is laminated on the first silicon substrate; and in the opening exposure step, the third silicon substrate and the oxide film are removed sequentially.

Preferably, the method further comprises a laminated substrate preparation step of preparing the laminated substrate before the mask pattern layer forming step.

In the method of manufacturing the nozzle plate according to the present invention, since the frame-shaped mask pattern layer is formed on the laminated substrate obtained by laminating the first and second silicon substrates on the oxide film, the straight section of the nozzle is formed in the first silicon substrate by using the first opening section of the mask pattern layer as the reference, and the tapered section of the nozzle is formed in the second silicon substrate by using the mask pattern layer as the reference, then it is possible to specify the hole diameter of the straight section on the basis of the first opening section. Consequently, when forming the straight section and the tapered section respectively in the first and second silicon substrates, the hole diameter of the straight section is specified on the basis of the single parameter. Thus, it is possible to form the straight section with high precision, while achieving high-precision management of the lengths of the straight section and the tapered section and preventing positional deviation therebetween.

Furthermore, by adjusting the shape of the first opening section of the mask pattern layer by using the silicon substrate having the (111) surface orientation as the first silicon substrate, it is possible to specify the shape of the straight section freely. By forming the straight section with a round (e.g., circular, ellipse, oval, etc.) hole shape rather than a quadrilateral hole shape which is liable to produce adherence of dirt and solidification of ink, it is possible to stabilize the ejection performance of the nozzle. Moreover, since the nozzle plate is manufactured by using the laminated substrate in which the first and second silicon substrates are laminated on the oxide film, then handling properties of the nozzle plate are improved and breaking of the nozzle plate is prevented in cases where the nozzle plate (first and second silicon substrates) has a small thickness.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

General Composition of Inkjet Head According to First Embodiment

Figure 1:
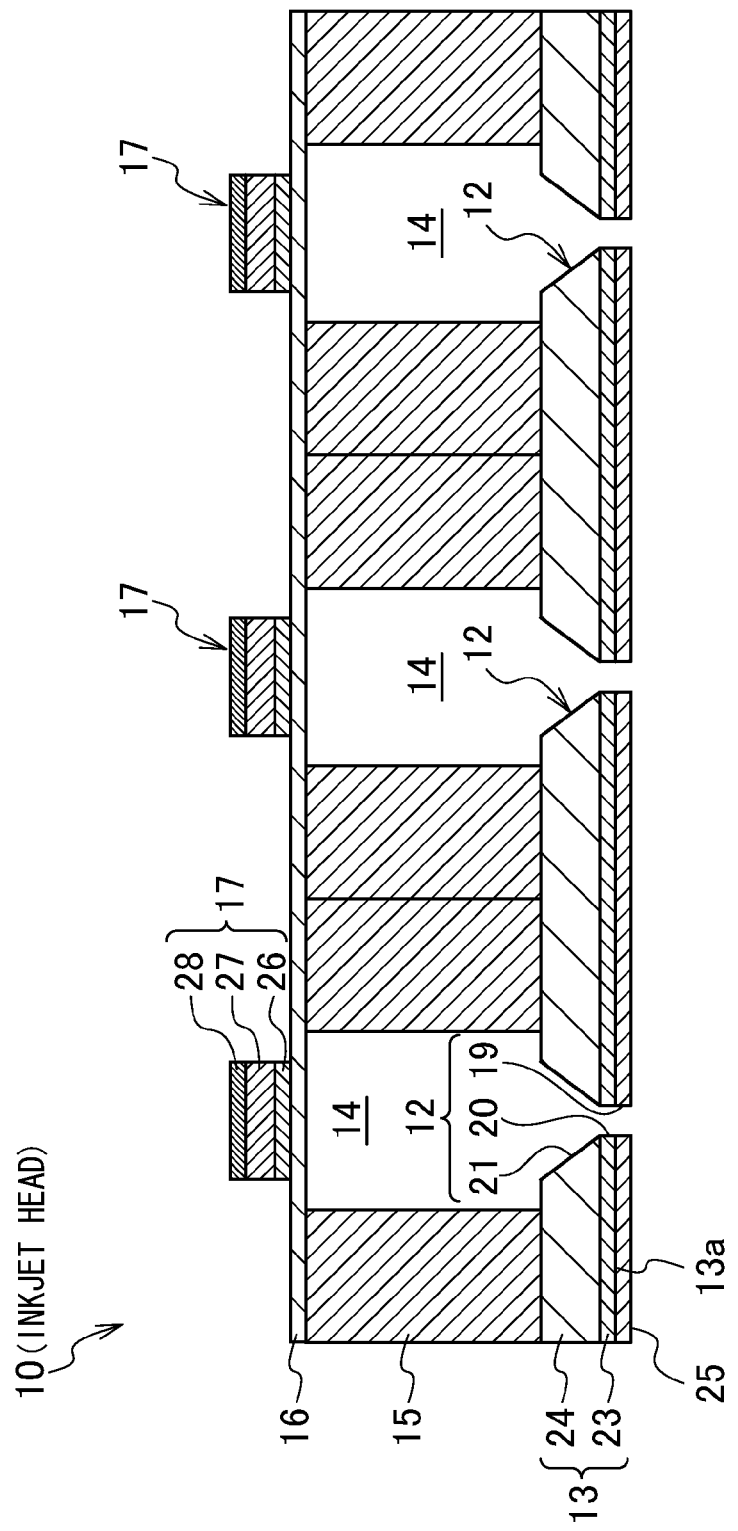
FIG. 1 is a cross-sectional diagram of an inkjet head according to a first embodiment of the invention.

FIG. 1 shows a cross-sectional view of an inkjet head 10, which includes: a nozzle plate 13, in which a plurality of nozzles 12 are formed; a flow channel substrate 15, in which flow channels such as pressure chambers 14 and a common flow channel (not shown), and the like, are formed; a diaphragm 16; and piezoelectric elements 17.

Each of the nozzles 12 is constituted of a nozzle opening 19, a straight section 20 and a tapered section 21. The nozzle opening 19 opens on a nozzle surface 13a of the nozzle plate 13 of the inkjet head 10. The straight section 20 has a cylindrical hole shape, which extends vertically (i.e., in a thickness direction of the nozzle plate 13) from the nozzle opening 19. The tapered section 21 is formed on an opposite side of the straight section 20 from the nozzle opening 19, and substantially has a funnel shape (a quadrilateral pyramid shape) (see FIGS. 16 to 18). The tapered section 21 is connected to the straight section 20 and gradually narrows toward the straight section 20.

The nozzle plate 13 is constituted of a first active layer (first silicon substrate) 23 and a second active layer (second silicon substrate) 24. The first active layer 23 contains the straight section 20. The second active layer 24 contains the nozzle surface 13a where the nozzle opening 19 is formed, and the tapered section 21. Furthermore, a liquid repellent film 25 is formed on the nozzle surface 13a in order to stabilize the ejection direction of ink droplets and to improve ejection performance.

The flow channel substrate 15 is made of silicon, for example, and constitutes side wall sections of the pressure chambers 14. Furthermore, the flow channel substrate 15 is formed with a supply port (not shown), which is a restrictor (most constricted portion) of an individual supply channel which leads the ink from the common flow channel (not shown) to each pressure chamber 14. For the sake of the description, a simplified view of the flow channel substrate 15 is given in FIG. 1, but the flow channel substrate 15 can have a structure formed by combining together one or more substrates. The common flow channel (not shown) is connected to an ink tank (not shown), which forms an ink supply source. The ink supplied from the ink tank is supplied to the pressure chambers 14 through the common flow channel.

The diaphragm 16 constitutes a ceiling face of each pressure chamber 14 (the upper face thereof in FIG. 1). Piezoelectric elements 17 are formed on the diaphragm 16. Each of the piezoelectric elements 17 is constituted of a lower electrode 26, a piezoelectric film 27 and an upper electrode 28, and is deformed by application of a drive voltage. By reducing the volume of the pressure chamber 14 through deforming the diaphragm 16 in accordance with the deformation of the piezoelectric element 17, pressure is applied to the ink inside the pressure chamber 14. Consequently, the ink is ejected through the corresponding nozzle 12.

Inkjet Head Manufacturing Procedure According to First Embodiment

Next, an inkjet head manufacturing procedure 30 for manufacturing the inkjet head 10 (hereinafter referred simply to as the "head manufacturing procedure 30") including a nozzle plate manufacturing procedure according to an embodiment of the present invention is described with reference to flow charts in FIGS. 2 to 4 and illustrative diagrams in FIGS. 5A to 24. In FIGS. 5A to 24, in order to avoid complication of the drawings, the manufacturing procedure is depicted for an ink ejection element of one channel, which is one unit of the recording elements of the inkjet head 10.

Figure 2:
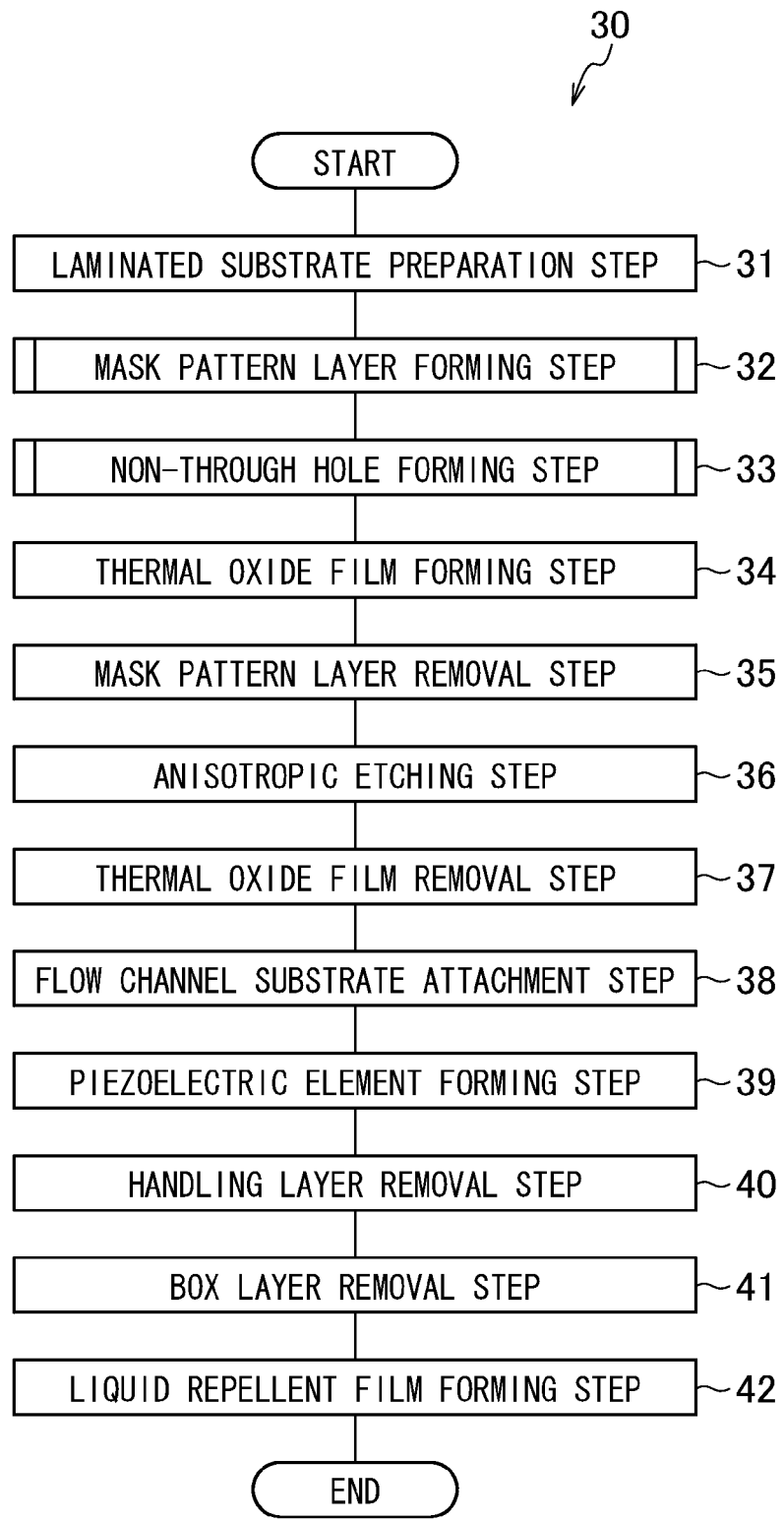
FIG. 2 is a flow chart of an inkjet head manufacturing procedure.

As shown in FIG. 2, the head manufacturing procedure 30 involves sequentially carrying out the following steps: a laminated substrate preparation step 31, a mask pattern layer forming step 32, a non-through hole forming step 33, a thermal oxide film forming step (protective film forming step) 34, a mask pattern layer removal step 35, an anisotropic etching step 36, a thermal oxide film removal step (protective film removal step) 37, a flow channel substrate attachment step 38, a piezoelectric element forming step 39, a handling layer removal step 40, a box layer removal step 41, and a liquid repellent film forming step 42. The handling layer removal step 40 and the box layer removal step 41 correspond to an opening exposure step according to the present invention.

In the inkjet head manufacturing procedure 30, when the box layer removal step 41 has been completed, the nozzle plate 13 shown in FIG. 1 is completed.

Figure 5A:
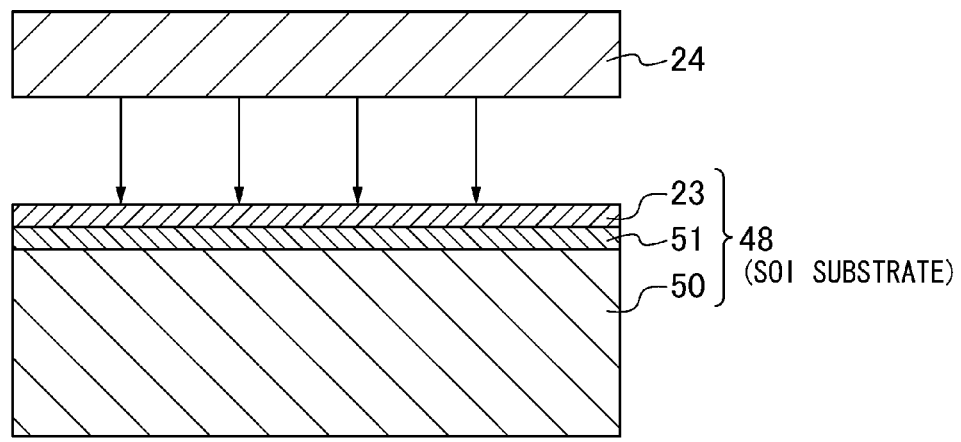
FIGS. 5A and 5B are illustrative diagrams for describing a laminated substrate preparation step.

As shown in FIG. 5A, the nozzle plate 13 is manufactured by using a silicon on insulator (SOI) substrate 48. The SOI substrate 48 is formed by sequentially arranging a box layer (referred also to as a "buried oxide film layer", corresponding to an oxide film in the present invention) 51 and a first active layer 23, over a handling layer (referred also to as a "supporting layer", corresponding to a third silicon substrate in the present invention) 50. Here, the term "over" refers to the upper side in FIG. 5A, and in this case indicates a direction from the handling layer 50 toward the second active layer 24 (the direction of lamination).

The handling layer 50 is a monocrystalline silicon substrate that has both planar surfaces along (100) crystal planes. There are no particular restrictions on the surface orientation of the handling layer 50. The thickness of the handling layer 50 is adjusted to 100 μm to 1000 μm. In this case, if the handling layer 50 is thinner than 400 μm, then the handling properties are poor and there is an increased probability of breaking of the substrate. On the other hand, if the handling layer is thicker than 500 μm, then the time required to remove the handling layer 50 in a subsequent step (the handling layer removal step 40) becomes longer, which leads to increased costs. Consequently, the thickness of the handling layer 50 is set to 500 μm in the present embodiment, and the thickness of about 400 μm is more desirable.

The box layer 51 is made of $SiO_2$, for example. The thickness of the box layer 51 is adjusted to 0.1 μm to 10 μm, and is set to 1 μm in the present embodiment.

The first active layer 23 is a monocrystalline silicon substrate that has both planar surfaces along (111) crystal planes. The thickness of the first active layer 23 is specified in accordance with the length of the straight section 20 in the thickness direction of the nozzle plate 13 (hereinafter referred simply to as the "length of the straight section 20"). The length of the straight section 20 can be specified in accordance with the ejection performances, more specifically, the properties and compatibility of the ink to be ejected, and the directionality of ejected droplets of the ink. The length of the straight section 20 is adjusted to 0.5 μm to 500 μm, for example, and is set to 5 μm in the present embodiment.

<Laminated Substrate Preparation Step>

Figure 5B:
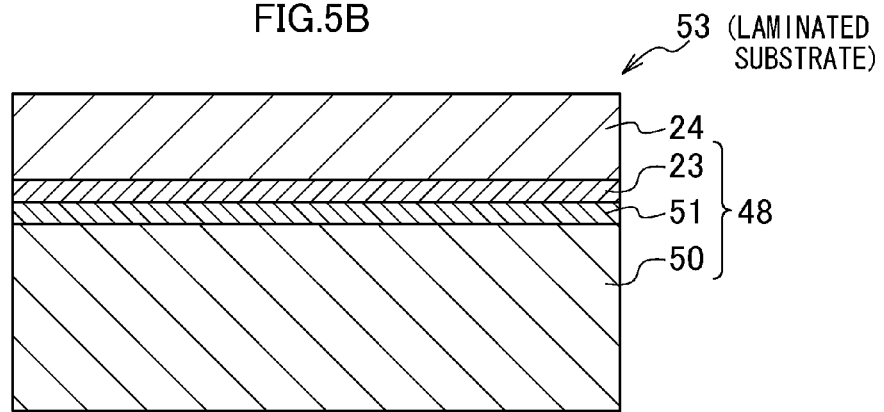

In the laminated substrate preparation step 31, as shown in FIG. 5B, a laminated substrate 53 is formed by layering (attaching or bonding) the second active layer 24, which is beforehand formed by slicing a silicon substrate, for example, over the first active layer 23. Thus, the first active layer 23 and the second active layer 24 are sequentially layered on one side of the box layer 51 (the upper side in FIG. 5B). Furthermore, the second active layer 24 can be adjusted to a prescribed thickness by being ground or polished, after being layered (attached) over the first active layer 23. If the second active layer is thin, then the handling properties of the substrate are poor and there is a high possibility of breaking of the substrate, and therefore it is preferable to grind or polish the second active layer after the lamination. The laminated substrate 53 can also be purchased as a manufactured item from a manufacturer.

The second active layer 24 is a monocrystalline silicon substrate that has both planar surfaces along (100) crystal planes. The thickness of the second active layer 24 is specified in accordance with the length of the tapered section 21 in the thickness direction of the nozzle plate 13 (hereinafter referred simply to as the "length of the tapered section 21"). The length of the tapered section 21 can be specified in accordance with the ejection performance, more specifically, the properties and compatibility of the ink to be ejected. The length of the tapered section 21 is adjusted to 0.5 μm to 500 μm, for example, and is set to 50 μm in the present embodiment in view of the ejection efficiencies of the ink and so on.

Thus, the lengths of the straight section 20 and the tapered section 21 are specified in accordance with the thicknesses of the first and second active layers 23 and 24. The thicknesses of the first and second active layers 23 and 24 can be managed with high precision during the manufacture of the laminated substrate 53 (the SOI substrate 48), and therefore the lengths of the straight section 20 and the tapered section 21 can also be managed with high precision.

The reason for forming the first and second active layers 23 and 24 from silicon is that, if a material other than silicon is used, variation in the physical properties of the materials, such as difference in the coefficients of thermal expansion, gives rise to warping of the nozzle plate 13 when heat treatment is carried out in the respective steps of the head manufacturing procedure 30. If there is warping of the nozzle plate 13, then problems arise in that the straight section 20 ceases to have a straight line shape, but rather becomes bent and deforms asymmetrically, for instance. Therefore, the first and second active layers 23 and 24 are made from silicon.

<Mask Pattern Layer Forming Step>

Figure 3:
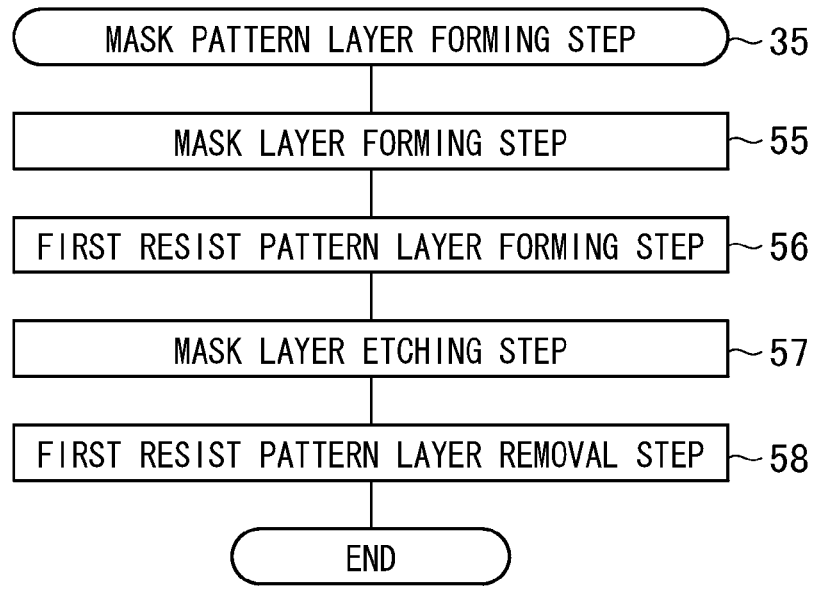
FIG. 3 is a flow chart of a mask pattern layer forming step.

In the mask pattern layer forming step 32, as shown in FIG. 3, a mask layer forming step 55, a first resist pattern layer forming step 56, a mask layer etching step 57 and a first resist pattern layer removal step 58 are carried out sequentially.

<<Mask Layer Forming Step>>

Figure 6:
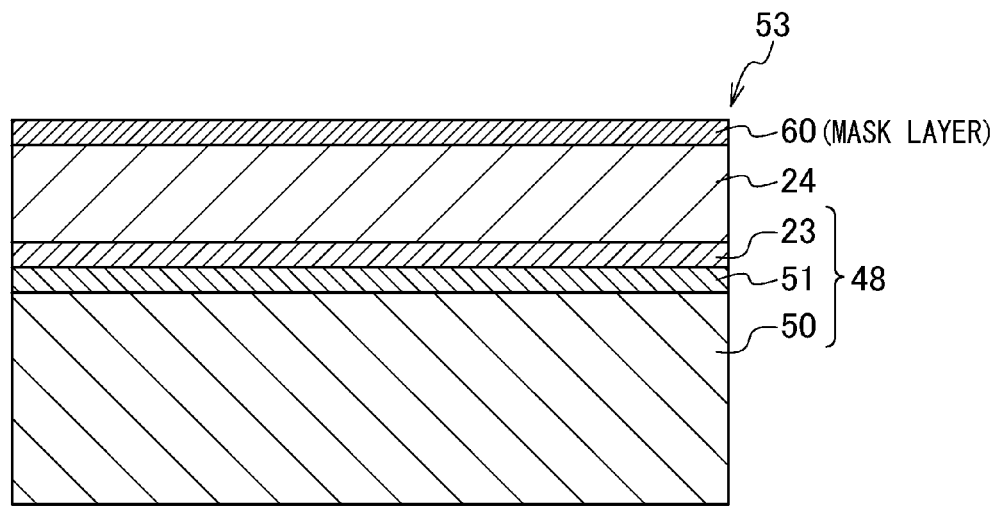
FIG. 6 is an illustrative diagram for describing a mask layer forming step.

In the mask layer forming step 55, a mask layer 60 is formed over the second active layer 24 as shown in FIG. 6. The mask layer 60 is made from $SiO_2$, SiN, SiC, $Al_2O_3$, or the like. Here, the mask layer 60 is subjected to thermal oxidation in the thermal oxide film forming step 34, which is carried out subsequently, and therefore the mask layer 60 should be made from a material other than a thermal oxide film of $SiO_2$ (silicon oxide). This is because the silicon layers (the first and second active layers 23 and 24) are selectively oxidized to form $SiO_2$ in the thermal oxide film forming step 34. Therefore, if the mask layer 60 is made from SiN, for instance, then the portions (the first and second active layers 23 and 24) apart from SiN can be oxidized selectively in the thermal oxide film forming step 34 (see FIG. 14). Consequently, in the present embodiment, the mask layer 60 is made from SiN. The mask layer 60 can be made from a material having thermal oxidization resisting properties, other than SiN.

The SiN film or mask layer 60 is formed by sputtering, vapor deposition (e.g., chemical vapor deposition (CVD)), or the like. For example, if the SiN film or mask layer 60 is formed using a CVD method, then it is possible to choose an LPCVD (low-pressure chemical vapor deposition) method, or a thermal CVD method. If a thermal CVD method is chosen, then an SiN film is generated by thermal reaction between $SiH_2Cl_2$ (dichlorosilane) and $NH_3$ (ammonia). The reaction pressure in this case is set to 20 Pa to 200 Pa, and the heating temperature is set to 650° C. to 800° C.

The thickness of the mask layer 60 is adjusted to approximately 0.1 µm to 5.0 µm, and is set to 0.5 µm in the present embodiment. The film thickness of the mask layer 60 can be set to the necessary film thickness on the basis of the selectivity of the etchant, such as KOH, used in the anisotropic etching step 36, which is carried out subsequently. In a case where KOH is used as the etchant, the selectivity to SiN is high and hence the required film thickness of the mask layer 60 can be reduced.

<<First Resist Pattern Layer Forming Step>>

Figure 7:
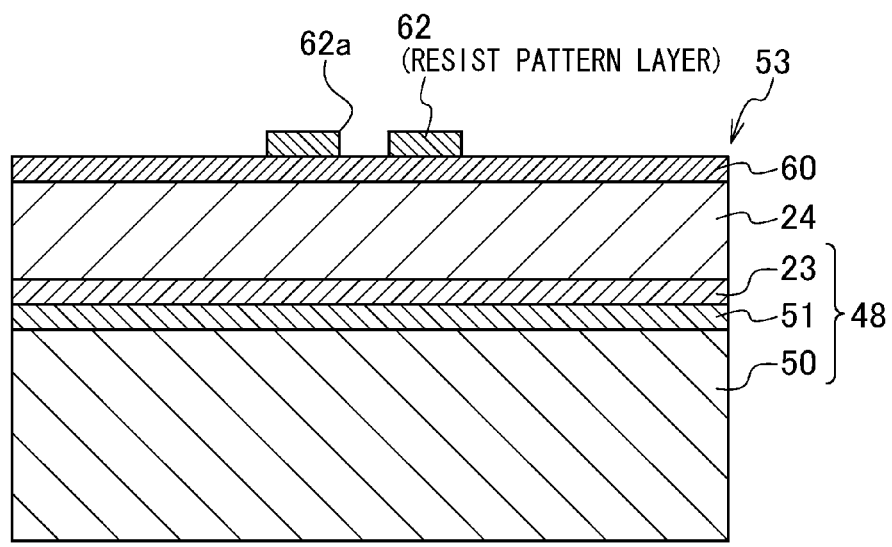
FIG. 7 is an illustrative diagram for describing a first resist pattern layer forming step.
Figure 8:
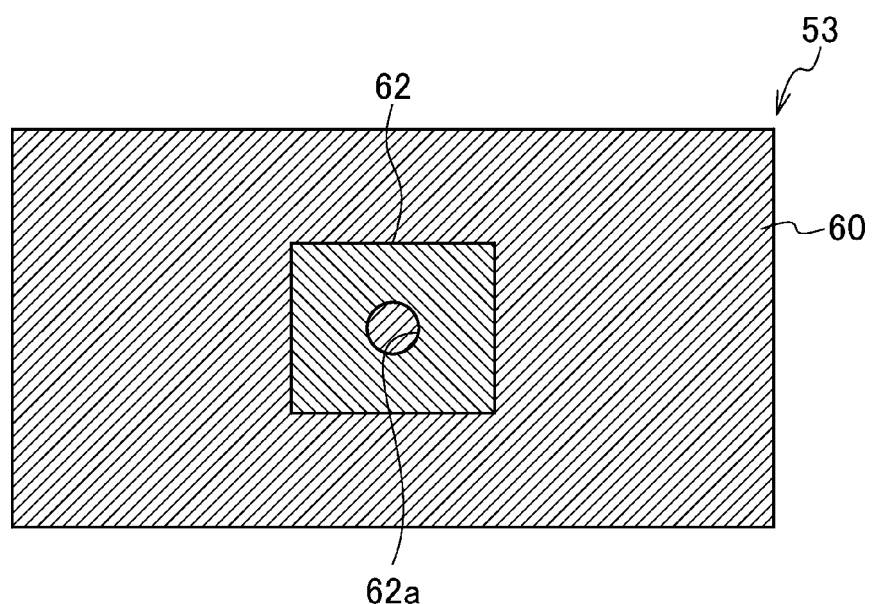
FIG. 8 is an illustrative diagram of the laminated substrate in FIG. 7 as viewed from the upper surface side.

In the first resist pattern layer forming step 56, a first resist pattern layer 62 is formed over the mask layer 60 as shown in FIGS. 7 and 8, by a resist layer forming step, a photolithography step and a post-baking step. In FIG. 8, in order to clarify the relationship with respect to FIG. 7, the mask layer 60 and the first resist pattern layer 62 are depicted in hatched fashion.

In the resist layer forming step, a resist layer (to be formed as the first resist pattern layer 62 in the subsequent step) is formed over the mask layer 60 by spin coating, spray coating, or the like, using a generic product of OFPR series or TSMR series made by Tokyo Ohka Kogyo. The film thickness of the resist layer is adjusted to 0.1 µm to 10 µm, and is set to 2 µm in the present embodiment. Thereupon, pre-baking is carried out in order to evaporate off the solvent component in the resist layer. The pre-baking employs a hot plate or an oven, and is carried out for two minutes at 100° C. using a hot plate in the present embodiment.

In the photolithography step, exposure is carried out to transfer the mask pattern to the resist layer using an exposure apparatus, such as a stepper or an aligner. The exposure time and/or amount of exposure light in this process are set to optimal values on the basis of the type of resist used in the resist layer and the thickness of the resist layer, and so on. After the exposure step, the resist layer is developed by using a special developing solution (for example, NMD-3 (tetramethylammonium hydroxide (TMAH) 2.38%) made by Tokyo Ohka Kogyo). In the present embodiment, the development time is set to one minute. Consequently, the first resist pattern layer 62 is formed in a frame shape over the mask layer 60 at a position where the nozzle 12 is to be formed.

The first resist pattern layer 62 is formed to have a quadrilateral outer shape (including an approximate quadrilateral shape), and a first resist opening section 62a is formed in a central portion thereof (including an approximate central portion thereof). The first resist opening section 62a defines the hole shape and hole diameter of the straight section 20, and in the present embodiment, is formed to a circular shape having a diameter of 20 µm.

Furthermore, the outer shape of the first resist pattern layer 62 defines the dimensions of the opening of the tapered section 21 on the side of the pressure chamber 14 shown in FIG. 1 (hereinafter referred simply to as the "opening of the tapered section 21"). The dimensions of the opening of the tapered section 21 are specified by the hole diameter of the straight section 20, the angle of the tapered section 21 and the thickness of the second active layer 24. More specifically, the hole diameter X of the straight section 20, the size Y of the opening of the tapered section 21, the thickness d of the second active layer 24, and the inclination angle θ of the tapered section 21 satisfy the following relationship:

$$Y = X + (d/\tan\theta) \times 2. \quad (1)$$

Consequently, if the straight section 20 has the hole diameter X of 20 µm, the first active layer 23 has the thickness d of 50 µm, and the tapered section 21 has the inclination angle θ of 54.74 degrees, then according to the above-described formula 1, the opening of the tapered section 21 has the size Y of approximately 90.6 µm. Therefore, the outer shape of the first resist pattern layer 62 is formed to the size of 90.6 µm.

Since the straight section 20 and the tapered section 21 of the nozzle 12 can be thus formed collectively by the first resist pattern layer 62, then the alignment of the straight section 20 and the tapered section 21 is not necessary and nozzle formation of high precision can be achieved.

In the post-baking step, the first resist pattern layer 62 after the development processing is post baked by using a hot plate, an oven, or the like. In the present embodiment, the post-baking is carried out for three minutes at 120° C. using a hot plate. By the foregoing, the first resist pattern layer forming step 56 is completed.

<<Mask Layer Etching Step>>

Figure 9:
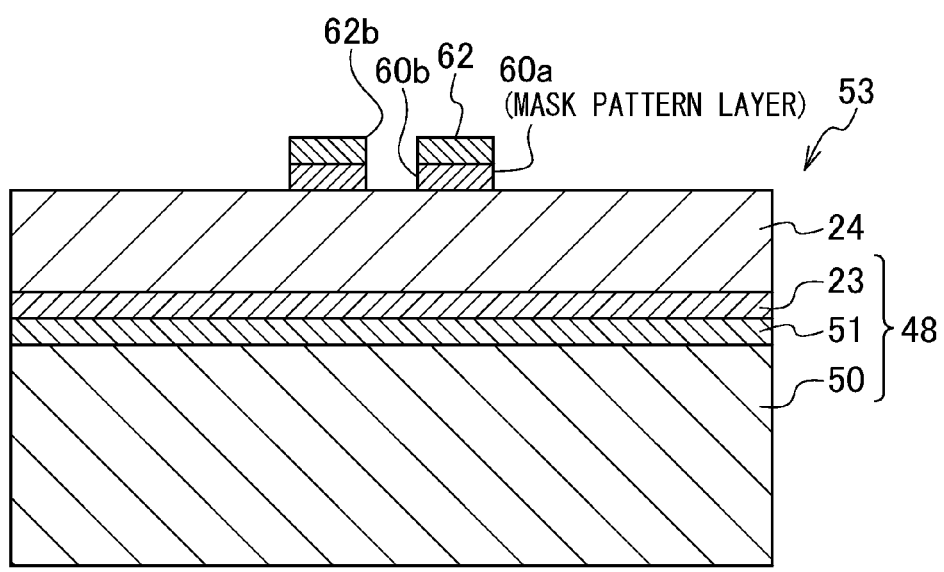
FIG. 9 is an illustrative diagram for describing a mask layer etching step.

In the mask layer etching step 57, the mask layer 60 is subjected to a dry etching process by a commonly known dry etching apparatus, using the first resist pattern layer 62 as a mask as shown in FIG. 9. A fluoric gas is used in the dry etching process. Instead of the dry etching, it is also possible to carry out anisotropic etching of various types.

When the portion of the mask layer 60 that is not covered with the first resist pattern layer 62 is removed by the dry etching process, the shape of the first resist pattern layer 62 is transferred to the mask layer 60. Consequently, a mask pattern layer 60a is formed over the second active layer 24 at the position where the nozzle 12 is to be formed.

The mask pattern layer 60a is formed with a quadrilateral outer shape, similarly to the first resist pattern layer 62, and forms a frame-shaped pattern having a circular mask opening section (first opening section) 60b in a central portion thereof. The shapes and dimensions of the mask pattern layer 60a and the mask opening section 60b are the same as the shapes and dimensions of the first resist pattern layer 62 and the first resist opening section 62a, respectively. The mask pattern layer 60a covers a position on the second active layer 24 where the tapered section 21 is to be formed, and the mask opening section 60b exposes a position on the second active layer 24 where the straight section 20 is to be formed.

<<First Resist Pattern Layer Removal Step>>

Figure 10:
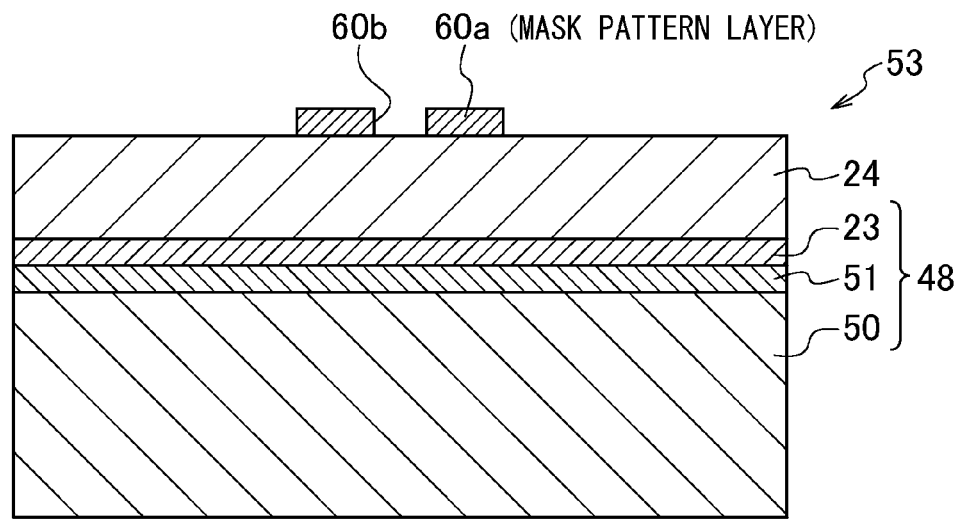
FIG. 10 is an illustrative diagram for describing a first resist pattern layer removal step.

In the first resist pattern layer removal step 58, the first resist pattern layer 62 is removed from the mask pattern layer 60a as shown in FIG. 10 by ashing or using a special remover solution. With the foregoing, the mask pattern layer forming step 32 is completed.

<Non-Through Hole Forming Step>

Figure 4:
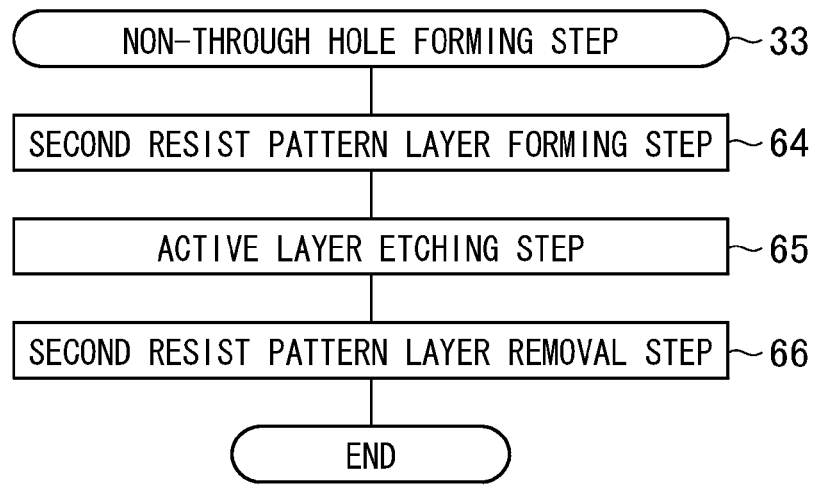
FIG. 4 is a flow chart of a non-through hole forming step.

In the non-through hole forming step 33, as shown in FIG. 4, a second resist pattern layer forming step 64, an active layer etching step (silicon substrate etching step) 65, and a second resist pattern layer removal step 66 are carried out sequentially.

<<Second Resist Pattern Layer Forming Step>>

Figure 11:
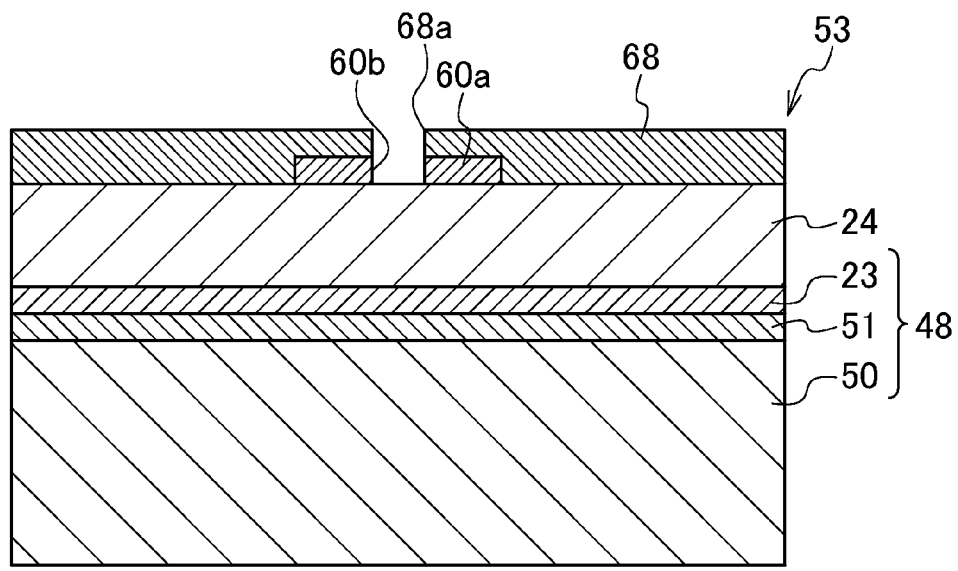
FIG. 11 is an illustrative diagram for describing a second resist pattern layer forming step.

In the second resist pattern layer forming step 64, a second resist pattern layer 68 is formed over the second active layer 24 and the mask pattern layer 60a as shown in FIG. 11. The second resist pattern layer 68 has a second resist opening section (second opening section) 68a, which exposes the mask opening section 60b, and masks the second active layer 24 and the mask pattern layer 60a. The second resist pattern layer 68 is formed by a similar method to the first resist pattern layer 62 described above (a resist layer forming step, a photolithography step, and so on), for example.

The alignment of the second resist opening section 68a with respect to the mask opening section 60b can be of low precision. This is because the positions of the tapered section 21 of the nozzle 12 and the ejection aperture of the straight section 20 are specified by the mask pattern layer 60a in the previous photolithography step (the mask pattern layer forming step 32), and therefore at the current stage, it is sufficient for the second resist pattern layer 68 (mask) to be situated over the second active layer 24 and the mask pattern layer 60a.

<<Active Layer Etching Step>>

Figure 12:
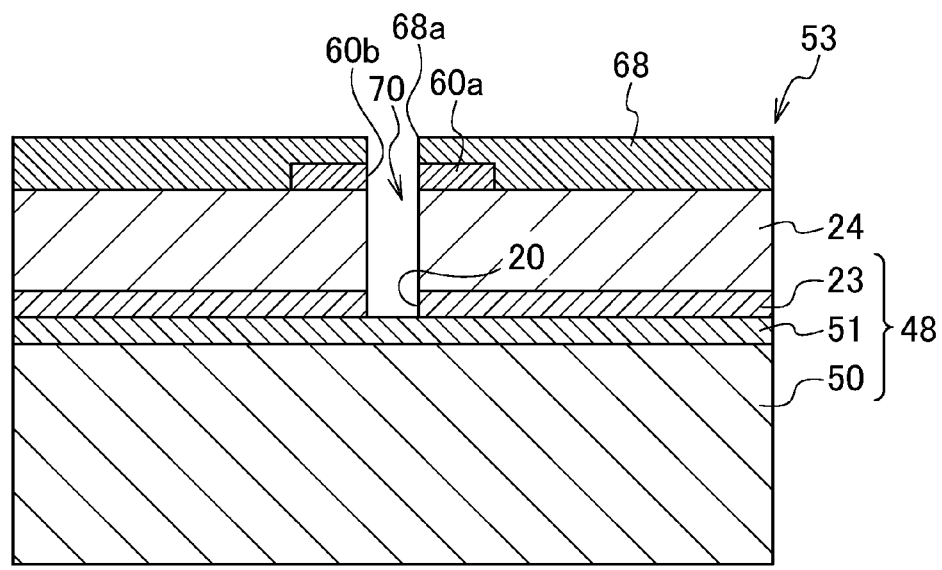
FIG. 12 is an illustrative diagram for describing an active layer etching step.

In the active layer etching step 65, the second active layer 24 and the first active layer 23 are subjected sequentially to a dry etching process by a commonly known dry etching apparatus, using the second resist pattern layer 68 as a mask, as shown in FIG. 12. Instead of the dry etching, it is also possible to carry out anisotropic etching of various types.

The first and second active layers 23 and 24 (i.e., the monocrystalline silicon substrates of which the surface orientations are (111) and (100), respectively) can be etched by the dry etching method regardless of their surface orientations. The dry etching can be carried out by means of a Bosch process, for example. The hole processing can be carried out vertically by alternately repeating an etching step using a fluoric gas, such as $SF_6$, and a polymer deposition step using a fluoric gas, such as $C_4F_8$. In this case, the resulting hole has regular roughness or scalloping on the side walls, and attempts are made to reduce the roughness, for instance, by shortening the respective durations of the etching and polymer deposition steps.

In the dry etching process, it is possible to use at least one type of fluoric gas, such as $SF_6$, $CF_4$, $CHF_3$, $C_4F_8$, or the like, and oxygen, as the etching gases. Moreover, it is possible to add an inert gas, such as Ar, $N_2$, He, or the like. No problems of scalloping occur if this method is employed, but if oxygen is used as the etching gas, then it is necessary to form a thick second resist pattern layer 68 in advance, taking account of the selectivity to the resist that is used as the mask (the second resist pattern layer 68). By carrying out the dry etching in the etching conditions having a 1:1 mixture of $SF_6$ and oxygen, it is possible to form the hole vertically.

By means of the dry etching process of this kind, the hole of which the shape (more specifically, the cross-sectional shape taken in a plane perpendicular to the depth direction of the hole) is the same with the second resist opening section 68a and the mask opening section 60b (i.e., the circular shape or the circular hole shape) is excavated down vertically toward one surface (the upper surface in FIG. 12) of the box layer 51. The dry etching is stopped by the box layer 51, which is the $SiO_2$ film. The box layer 51 thereby functions as an etching stopper for the dry etching. Thus, a non-through hole 70, which reaches the surface of the box layer 51, is formed through the second active layer 24 and the first active layer 23, at the position where the nozzle 12 is to be formed in the laminated substrate 53. Here, the first and second active layers 23 and 24 are both made of silicon and can therefore be processed collectively.

By forming the non-through hole 70, the straight section 20 is formed as a portion of the non-through hole 70 in the first active layer 23. Because the non-through hole 70 is formed in the circular hole shape (having the circular shape in the cross-section taken in a plane perpendicular to the depth direction of the hole), then the straight section 20 is also formed in the circular hole shape.

Here, if a monocrystalline silicon substrate that has the (110) surface orientation is used as the first active layer 23, then a straight section having a quadrilateral hole shape (having a quadrilateral shape in the cross-section taken in a plane perpendicular to the depth direction of the hole) is formed. If the straight section has the quadrilateral hole shape, then during ejection of droplets of the ink, the flow rate of the ink differs between the corner portions and the other portions of the quadrilateral shape, and this is undesirable in that it can cause adherence of dirt and solidification of the ink.

On the other hand, in the present embodiment, by using the monocrystalline silicon substrate that has the (111) surface orientation as the first active layer 23 and by adjusting the shape of the second resist opening section 68a and the mask opening section 60b by the photolithography process, it is possible to freely set the shape of the straight section 20. Consequently, the straight section 20 can also be set to shapes other than the circular hole shape, but by setting the cross-sectional shape of the straight section 20 to a round shape (e.g., the circular shape, an ellipse shape, an oval shape, etc.), the ejection performance of the nozzle 12 can be stabilized.

The hole diameter of the straight section 20 is specified in accordance with the size (opening diameter) of the first resist opening section 62a (the mask opening section 60b). The length of the straight section 20 is specified in accordance with the thickness of the first active layer 23.

<<Second Resist Pattern Layer Removal Step>>

Figure 13:
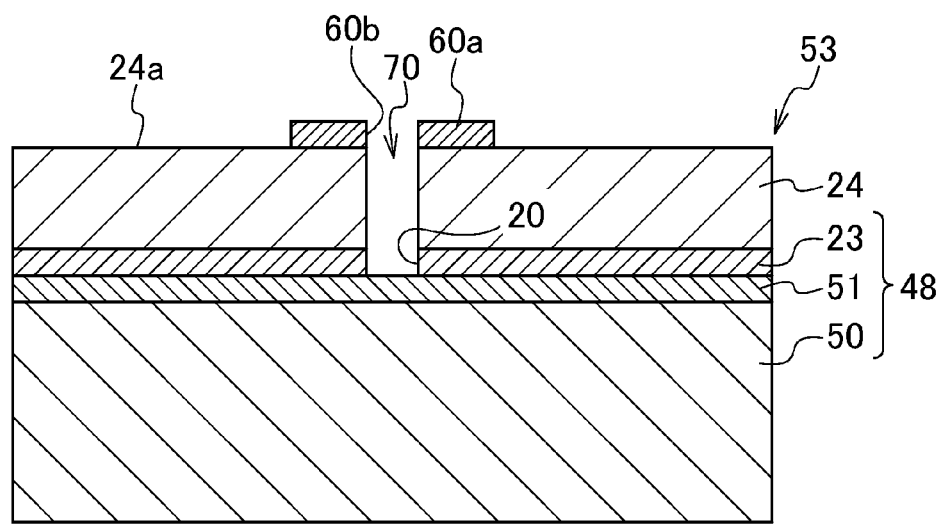
FIG. 13 is an illustrative diagram for describing a second resist pattern layer removal step.

In the second resist pattern layer removal step 66, the second resist pattern layer 68 is removed from the second active layer 24 and the mask pattern layer 60a as shown in FIG. 13 by ashing or using a special remover solution. With the foregoing, the non-through hole forming step 33 is completed.

<Thermal Oxide Film Forming Step>

Figure 14:
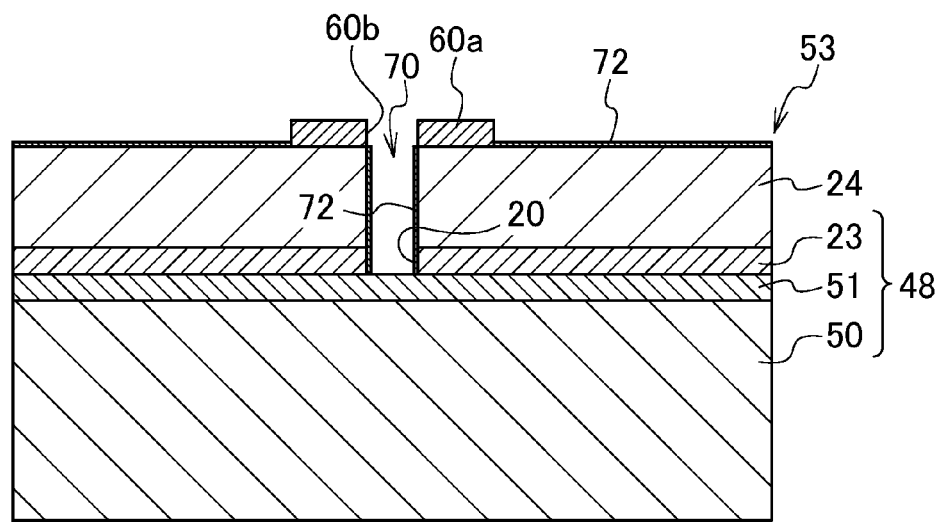
FIG. 14 is an illustrative diagram for describing a thermal oxide film forming step.

In the thermal oxide film forming step 34, thermal oxidation processing is carried out on the portions of the laminated substrate 53 which are not masked by the mask pattern layer 60a, using a thermal oxide film forming method, such as wet oxidization or dry oxidization, for instance, thereby forming a thermal oxide film 72 ($SiO_2$ in the present embodiment) corresponding to the protective film of the present invention, as shown in FIG. 14. The thermal oxide film 72 is formed on an unmasked portion (corresponding to a first portion) 24a (shown in FIG. 13), which is not covered with the mask pattern layer 60a on the second active layer 24, and also on inner surfaces of the first and second active layers 23 and 24 where the non-through hole 70 is formed (hereinafter referred simply to as the "inner surfaces of the non-through hole 70").

For example, when the wet oxidization is carried out, oxygen and water vapor are introduced through a tube heated to 800° C. to 1200° C. and react with silicon to form the film of silicon oxide ($SiO_2$).

<Mask Pattern Layer Removal Step>

Figure 15:
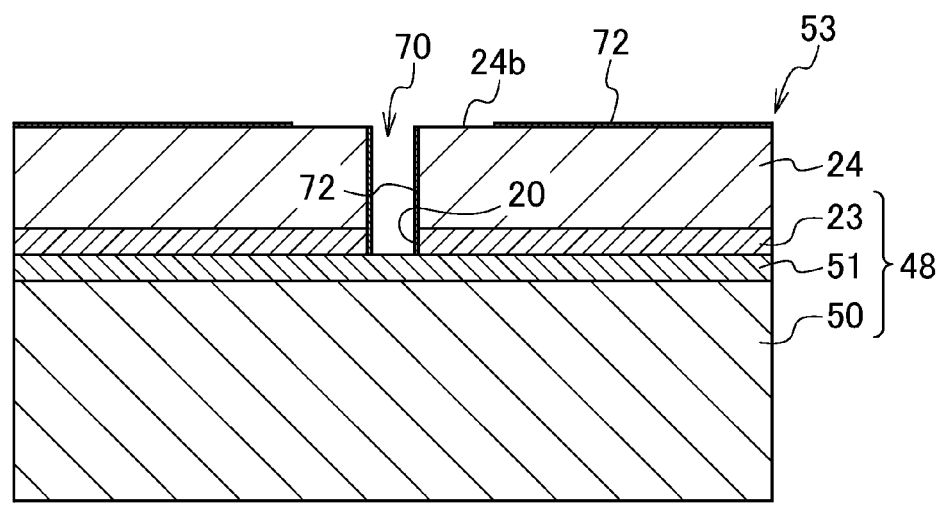
FIG. 15 is an illustrative diagram for describing a mask pattern layer removal step.

In the mask pattern layer forming step 35, the mask pattern layer 60a over the second active layer 24 is removed as shown in FIG. 15. In the present embodiment, the mask pattern layer 60a is removed by wet etching (a method other than wet etching can also be adopted). Phosphoric acid heated to 100° C. to 150° C. is used for the wet etching. Thereby, the portion of the second active layer 24 that has been covered with the mask pattern layer 60a is exposed. This exposed portion is hereinafter referred to as an exposed portion (corresponding to a second portion) 24b.

<Anisotropic Etching Step>

In the anisotropic etching step 36, the second active layer 24 is anisotropically etched by a wet etching apparatus, using the thermal oxide film 72 as the mask. Since the unmasked portion 24a (see FIG. 13) of the second active layer 24 and the inner side surfaces of the non-through hole 70 are masked by the thermal oxide film 72, and the box layer ($SiO_2$) is exposed in the bottom surface of the non-through hole 70, then the second active layer 24 is anisotropically etched through the exposed portion 24b.

It is possible to use an etching solution containing KOH, TMAH, and the like, for the anisotropic etching, and in the present embodiment, an etching solution containing KOH, for example, an "ELM-SiM" silicon etching solution made by Mitsubishi Gas Chemical is used. ELM-SiM is a KOH-based etching solution, and is used by heating a mixture of a KOH base solution and a solution containing hydroxylamine, combined in a weight ratio of 1:1, to a temperature of 50° C. to 90° C. (in the present embodiment, to 80° C.). The uniformity of the etching is improved by rotating the laminated substrate 53 (at 45 rpm, for example, in the present embodiment) while carrying out the anisotropic etching.

Since the second active layer 24 has the top surface along the (100) crystal plane, then the second active layer 24 has {111} crystal planes each having an angle of 45° with respect to the top surface. Here, the etching rates in the surfaces of the monocrystalline silicon greatly vary depending on the orientations of the surfaces. More specifically, the etching rate in the surface along the (100) plane is 10 to 1000 times as high as the etching rate of the surface along the (111) plane. For example, if the etching rate of the (100) surface is 1 μm/min, then the etching rate of the (111) surface is 1 nm/min to 100 nm/min, and hence the etching in the (111) surface hardly progresses at all.

On the other hand, since the first active layer 23 has the top surface along the (111) crystal plane, then similarly, the etching hardly progresses at all in the (111) surface of the first active layer 23 that is adjacent to the second active layer 24. Therefore, the first active layer 23 functions as an etching stopper which stops the anisotropic etching of the second active layer 24.

Figure 16:
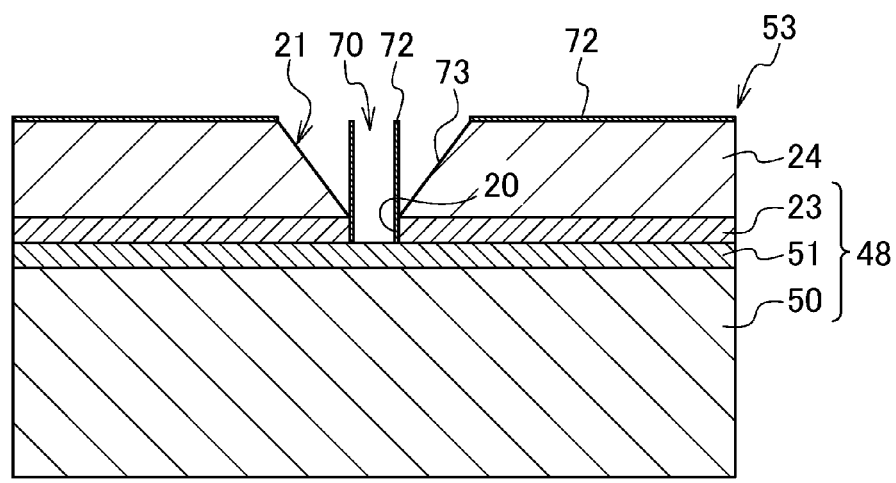
FIG. 16 is an illustrative diagram for describing an anisotropic etching step.
Figure 17:
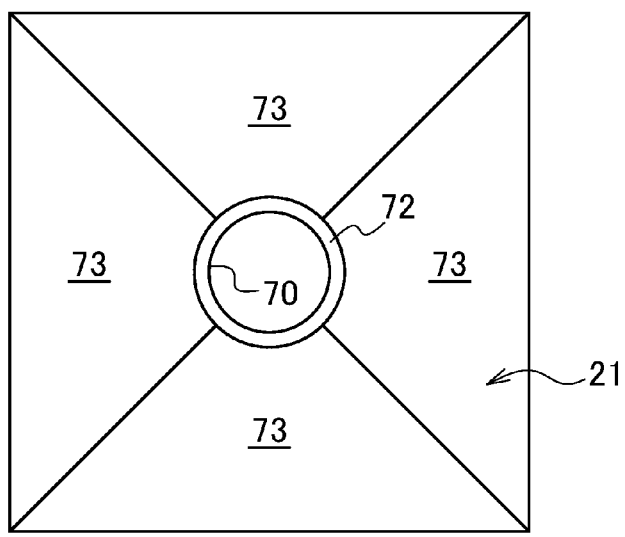
FIG. 17 is a front side diagram of a tapered section after the anisotropic etching step.
Figure 18:
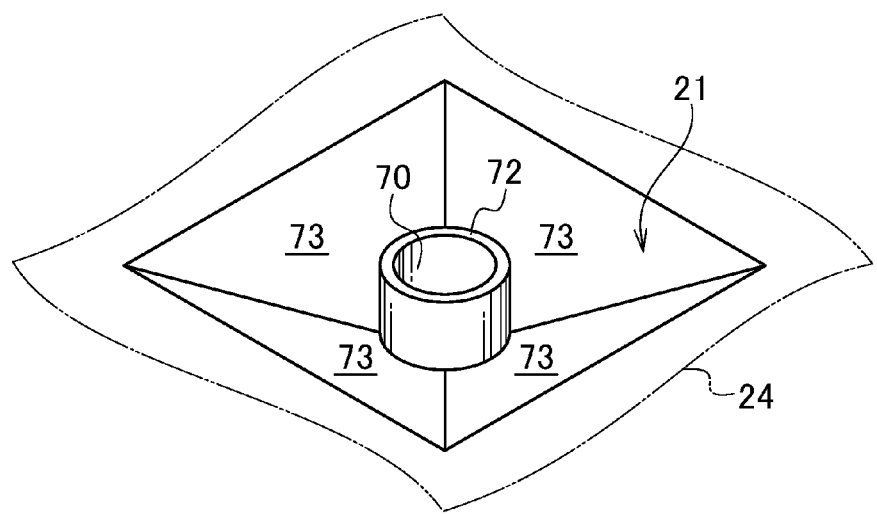
FIG. 18 is a perspective diagram of the tapered section after the anisotropic etching step.

As shown in FIGS. 16 to 18, the second active layer 24 is anisotropically etched from the exposed portion 24b toward the side of the first active layer 23, by the etching solution. When the anisotropic etching of the second active layer 24 is carried out until reaching the first active layer 23, the etching rate in the direction from the second active layer 24 toward the first active layer 23 (the downward direction in FIG. 16) declines greatly due to the (111) surface of the first active layer 23. Consequently, the etching in the downward direction in FIG. 16 is stopped.

Furthermore, when four {111} surfaces 73 are exposed in the second active layer 24 by the anisotropic etching, the etching rate declines greatly, and therefore the anisotropic etching in the second active layer 24 is also stopped. Consequently, the tapered section 21 having the approximate quadrilateral pyramid shape (approximate funnel shape), which is defined with the four {111} surfaces 73, is formed in the second active layer 24. The tapered section 21 is connected to the straight section 20 (when the thermal oxide film 72 is removed in a subsequent step) and gradually narrows as it approaches the straight section 20.

The size of the quadrilateral opening of the tapered section 21 is specified in accordance with the size of the exposed portion 24b, in other words, the outer shape of the first resist pattern layer 62 (the mask pattern layer 60a). Therefore, the size of the opening of the tapered section 21 can be adjusted readily by adjusting the size of the outer shape of the first resist pattern layer 62 (the mask pattern layer 60a). Moreover, the length of the tapered section 21 is specified in accordance with the thickness of the second active layer 24.

Hence, the lengths of the straight section 20 and the tapered section 21 of the nozzle 12 can be specified by the thicknesses of the first active layer 23 and the second active layer 24. The thicknesses of both the first and second active layers 23 and 24 can be managed with high precision during the manufacture of the laminated substrate 53 (the SOI substrate 48), and therefore the lengths of the straight section 20 and the tapered section 21 can also be managed with high precision.

Furthermore, the straight section 20 and the tapered section 21 of the nozzle 12 are formed with reference to the first resist pattern layer 62 (the mask pattern layer 60a), and therefore the photolithography process is only carried out once for defining the shapes and the positions of the straight section 20 and the tapered section 21. Therefore, the tapered section 21 and the straight section 20 (the non-through hole 70) are formed coaxially, and the positional deviation between the tapered section 21 and the straight section 20 is prevented. Thus, the nozzle formation of high precision can be achieved.

Moreover, since a substantially right-angled step section is not present between the straight section 20 and the tapered section 21, then even if the ink contains bubbles, the bubbles do not remain in the step section, and hence decline in the ejection performance is prevented. By this means, it is possible to achieve smooth ejection of ink droplets.

<Thermal Oxide Film Removal Step>

Figure 19:
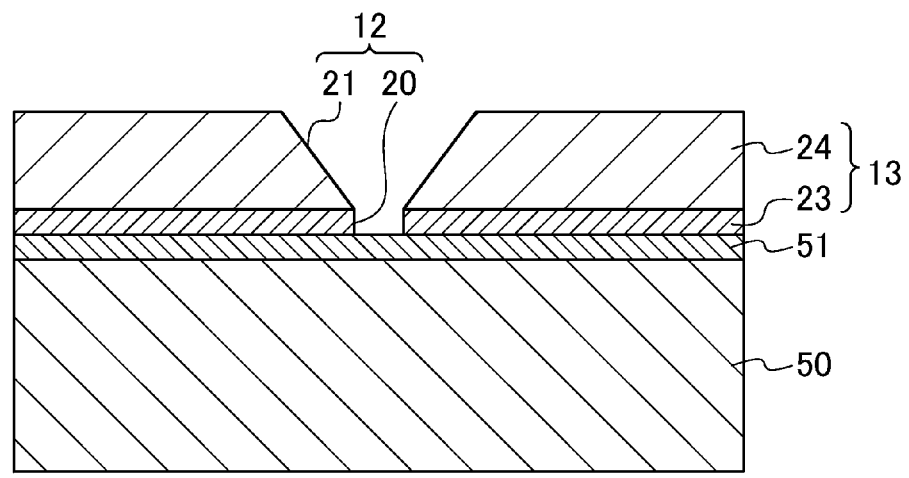
FIG. 19 is an illustrative diagram for describing a thermal oxide film removal step.

In the thermal oxide film removal step 37, the thermal oxide film 72 is removed from the laminated substrate 53 as shown in FIG. 19, by carrying out wet etching (e.g., using a HF or BHF solution), or the like. If the BHF solution is a 10:1 mixture, and the thermal oxide film 72 has the thickness of 1 μm, then the thermal oxide film 72 can be removed by the etching for about 15 minutes. Consequently, the nozzle plate 13 is formed in the state of being laminated over the handling layer 50 and the box layer 51. If the handling layer 50 and the box layer 51 are removed at this stage, the nozzle plate 13 is completed. The nozzles 12 each having the straight sections 20 and the tapered sections 21 are formed in the nozzle plate 13 by the respective steps described above.

<Flow Channel Substrate Attachment Step>

Figure 20:
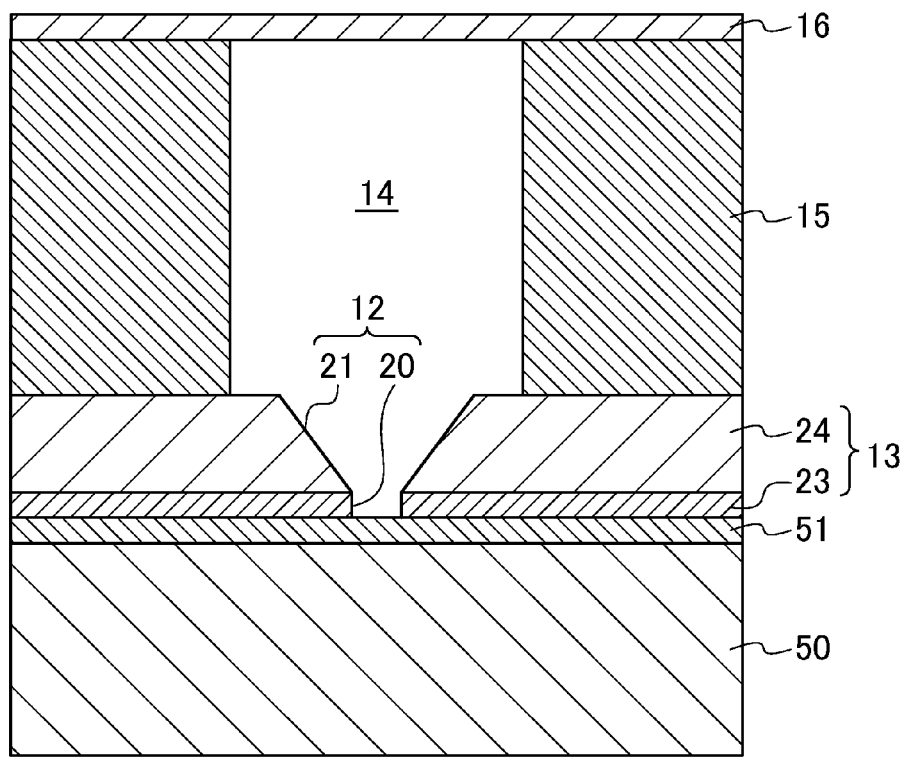
FIG. 20 is an illustrative diagram for describing a flow channel substrate attachment step.

In the flow channel substrate attachment step 38, the flow channel substrate 15 to which the diaphragm 16 has been bonded is attached on the second active layer 24 and bonded together, as shown in FIG. 20. Since the second active layer 24 and the flow channel substrate 15 are both made from silicon, then they are bond directly to each other.

<Piezoelectric Element Forming Step>

Figure 21:
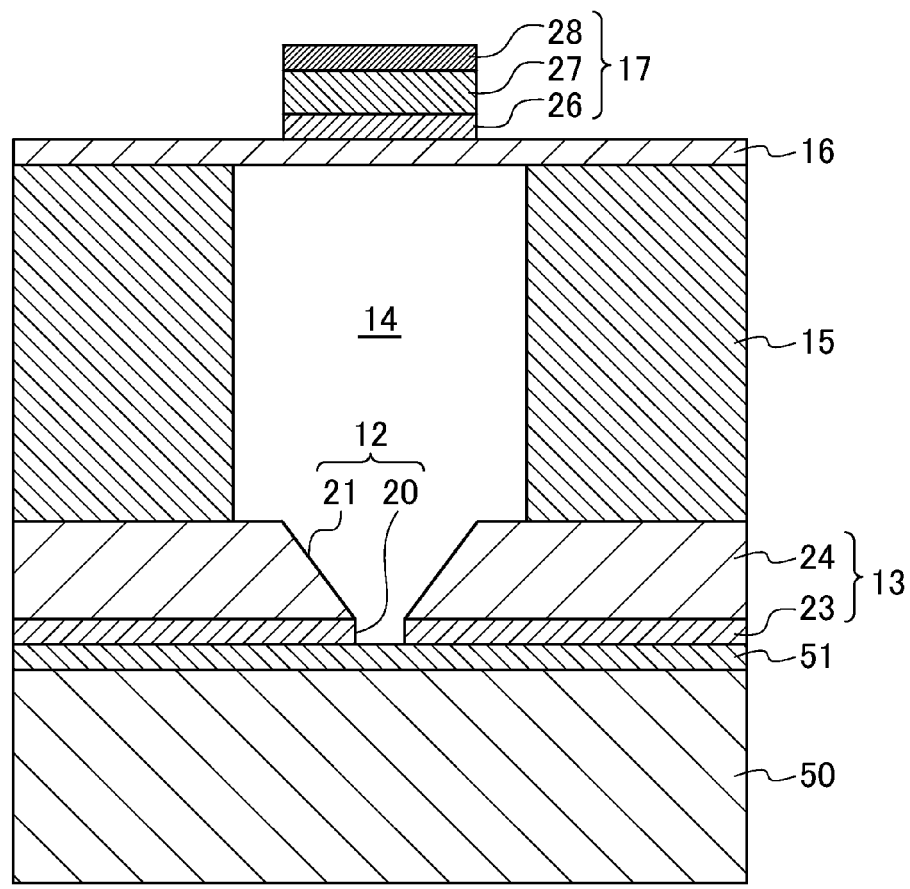
FIG. 21 is an illustrative diagram for describing a piezoelectric element forming step.

In the piezoelectric element forming step 39, the piezoelectric element 17 is formed by arranging the lower electrode 26, the piezoelectric film 27 and the upper electrode 28 on the surface of the diaphragm 16 reverse to the surface that faces the pressure chamber 14, as shown in FIG. 21. Since the method of forming the piezoelectric element 17 is commonly known, then detailed description thereof is omitted here.

<Handling Layer Removal Step>

Figure 22:
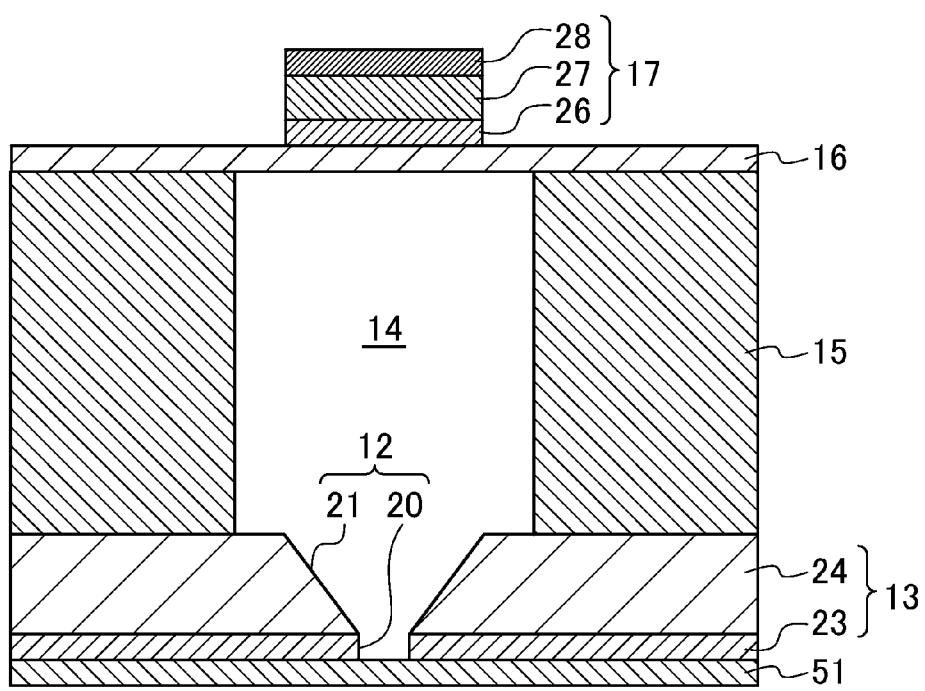
FIG. 22 is an illustrative diagram for describing a handling layer removal step.

In the handling layer removal step 40, the handling layer 50 is reduced by grinding and/or polishing until the thickness thereof becomes several micrometers (μm) to several tens micrometers, as shown in FIG. 22. For example, the handling layer 50 is ground by dry polishing. The remaining handling layer 50 is removed by dry etching. By carrying out the dry etching using a fluoric plasma, or the like, it is possible to etch and remove the handling layer 50 only, for example. The method of removing the handling layer 50 is not limited to the dry polishing and the dry etching, and can be performed by various commonly known polishing, grinding or etching methods.

<Box Layer Removal Step>

Figure 23:
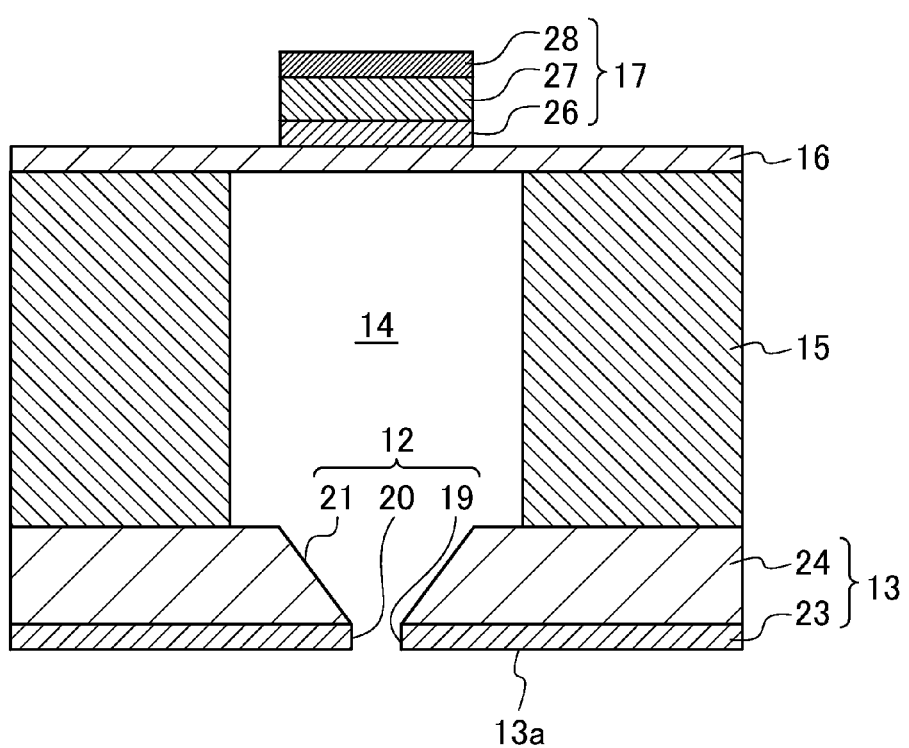
FIG. 23 is an illustrative diagram for describing a box layer removal step.

In the box layer removal step 41, the box layer ($SiO_2$) 51 is removed as shown in FIG. 23 by dry etching, for example. By using a fluoric plasma, for example, it is possible to selectively remove the box layer 51. Consequently, the nozzle surface 13a of the nozzle plate 13 and the nozzle openings 19 of the respective nozzles 12 are exposed. The method of removing the box layer 51 is not limited to the dry etching, and can be performed by various commonly known polishing, grinding or etching methods.

<Liquid Repellent Film Forming Step>

Figure 24:
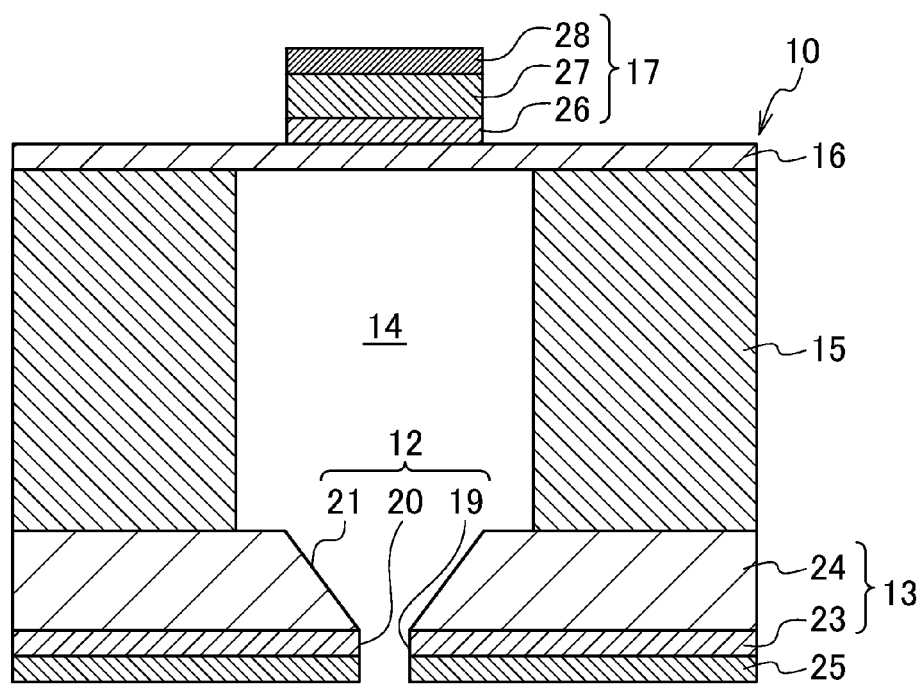
FIG. 24 is an illustrative diagram for describing a liquid repellent film forming step.

In the liquid repellent film forming step 42, the liquid repellent film 25 is formed on the nozzle surface 13a by spin coating, dip coating, vapor deposition, CVD, or the like, as shown in FIG. 24. The liquid repellent film 25 is formed by using Saitop (tradename) or Optool (tradename), for example. With the foregoing, all of the steps in the head manufacturing procedure 30 are completed, and the inkjet head 10 is completed.

<Beneficial Effects of Inkjet Head Manufacturing Procedure According to First Embodiment>

In the head manufacturing procedure 30 described above, when forming the straight section 20 and the tapered section 21 of the nozzle 12 in the first and second active layers 23 and 24, respectively, it is possible to specify the hole diameter of the straight section 20 (the aperture diameter of the nozzle opening 19) in accordance with the first resist opening section 62a (the mask opening section 60b). That is, the hole diameter of the straight section 20 is specified by one parameter. Hence, it is possible to form the straight section 20 with high precision, while achieving high-precision management of the lengths of the straight section 20 and the tapered section 21 and preventing positional deviation therebetween.

Furthermore, by using the monocrystalline silicon substrate having the (111) surface orientation as the first active layer 23 and by adjusting the shape of the second resist opening section 68a (the mask opening section 60b), it is possible to set the shape of the straight section 20 freely. By forming the straight section 20 with the circular hole shape rather than the quadrilateral hole shape, which is liable to produce adherence of dirt and solidification of the ink, it is possible to stabilize the ejection performance of the nozzle 12. Moreover, since the nozzle plate 13 is manufactured by using the laminated substrate 53 in which the second active layer 24 is layered over the SOI substrate 48, then it is possible to prevent breaking of the nozzle plate 13 due to poor handling properties, in cases where the nozzle plate 13 (the first and second active layers 23 and 24) has a small thickness.

General Composition of Inkjet Head According to Second Embodiment

Figure 25:
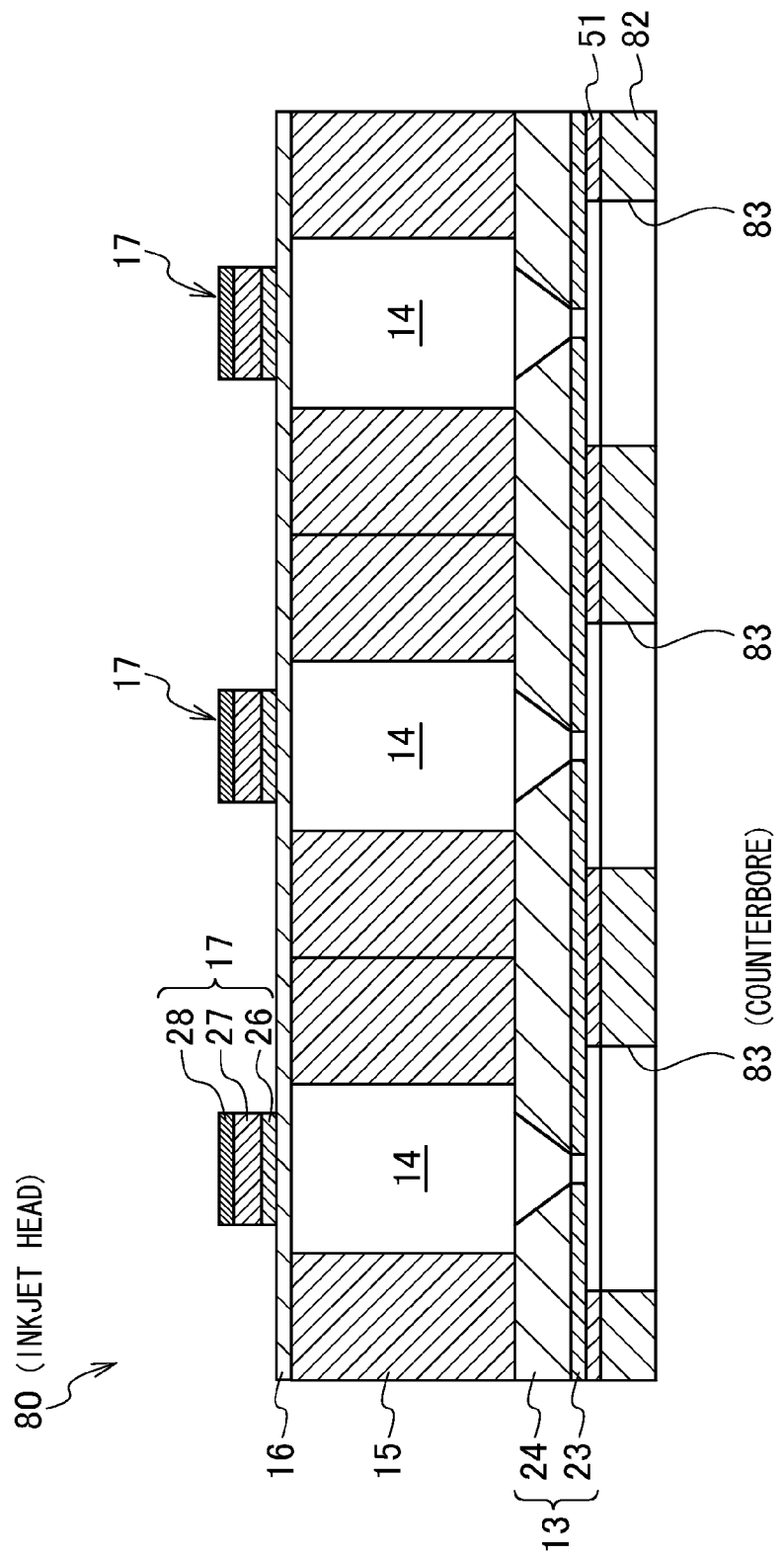
FIG. 25 is a cross-sectional diagram of an inkjet head according to a second embodiment.
Figure 26:
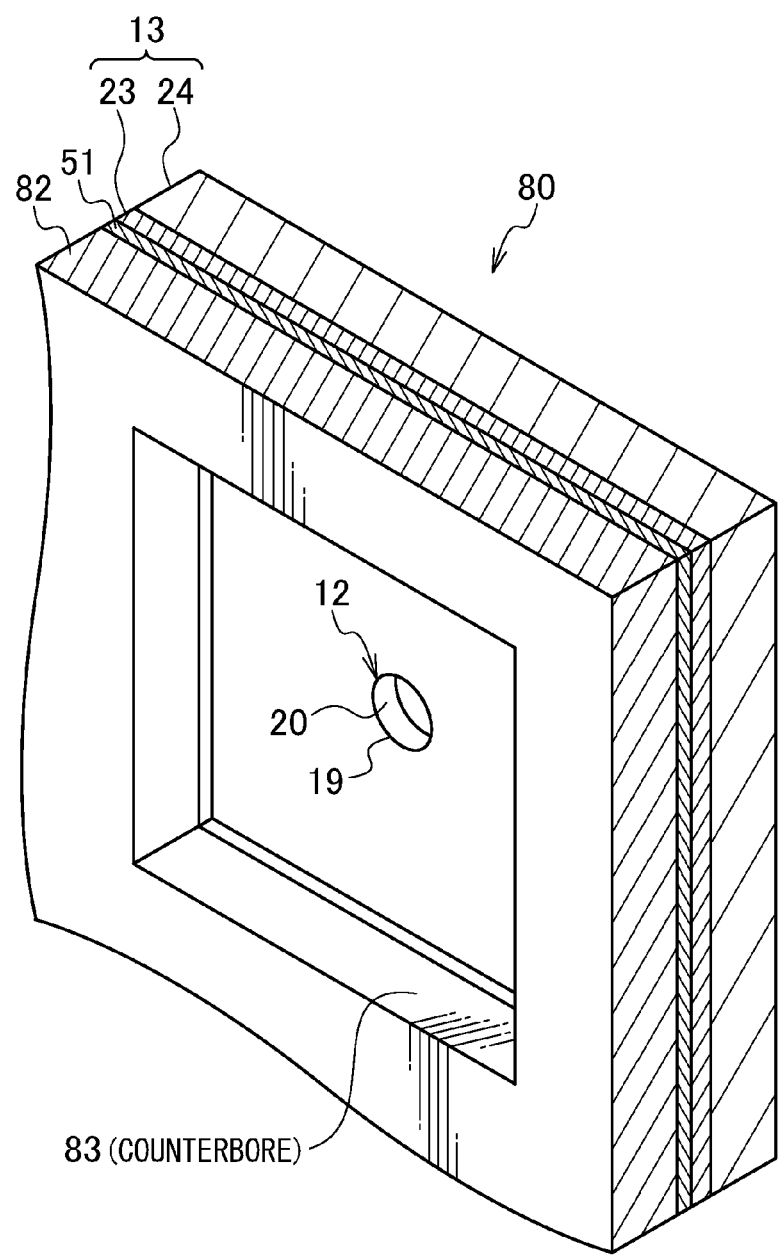
FIG. 26 is a perspective diagram of a counterbore of the inkjet head.

Next, an inkjet head 80 according to a second embodiment of the present invention is described with reference to FIGS. 25 and 26. In the inkjet head 10 according to the first embodiment described above, the whole of the handling layer 50 and the box layer 51 is removed from the nozzle surface 13a of the nozzle plate 13. On the other hand, the inkjet head 80 has the box layer 51, a handling layer 82 having the (110) surface orientation, and quadrilateral counterbores 83 formed in the handling layer 82. The inkjet head 80 in the second embodiment also has the liquid repellent film 25, which is not shown in the drawings in order to prevent complication of the drawings.

The inkjet head 80 has basically the same composition as the inkjet head 10 of the first embodiment, apart from the fact that the inkjet head 80 has the box layer 51, the handling layer 82 and the counterbores 83; and the constituent parts which are the same in the functions and compositions as those of the inkjet head 10 in the first embodiment described above are denoted with the same reference numerals, and description thereof is omitted here.

The counterbores 83 are arranged at positions corresponding to the nozzle openings 19 of the nozzles 12. The nozzle openings 19 are exposed through the counterbores 83. The counterbore 83 shown in FIG. 26 has a quadrilateral cross-section along a plane parallel to the front and rear surfaces of the nozzle plate 13, but can also be of a shape having a cross-section that is not quadrilateral.

Inkjet Head Manufacturing Procedure According to Second Embodiment

Next, an inkjet head manufacturing procedure 84 for manufacturing the inkjet head 80 (hereinafter referred simply to as the "head manufacturing procedure 84") including a nozzle plate manufacturing procedure according to the second embodiment of the present invention is described with reference to a flow chart in FIG. 27 and illustrative diagrams in FIGS. 28 to 35. In FIGS. 28 to 35, the manufacturing procedure is depicted for an ink ejection element of one channel, which is one unit of the recording elements of the inkjet head 80, similarly to the first embodiment.

Figure 27:
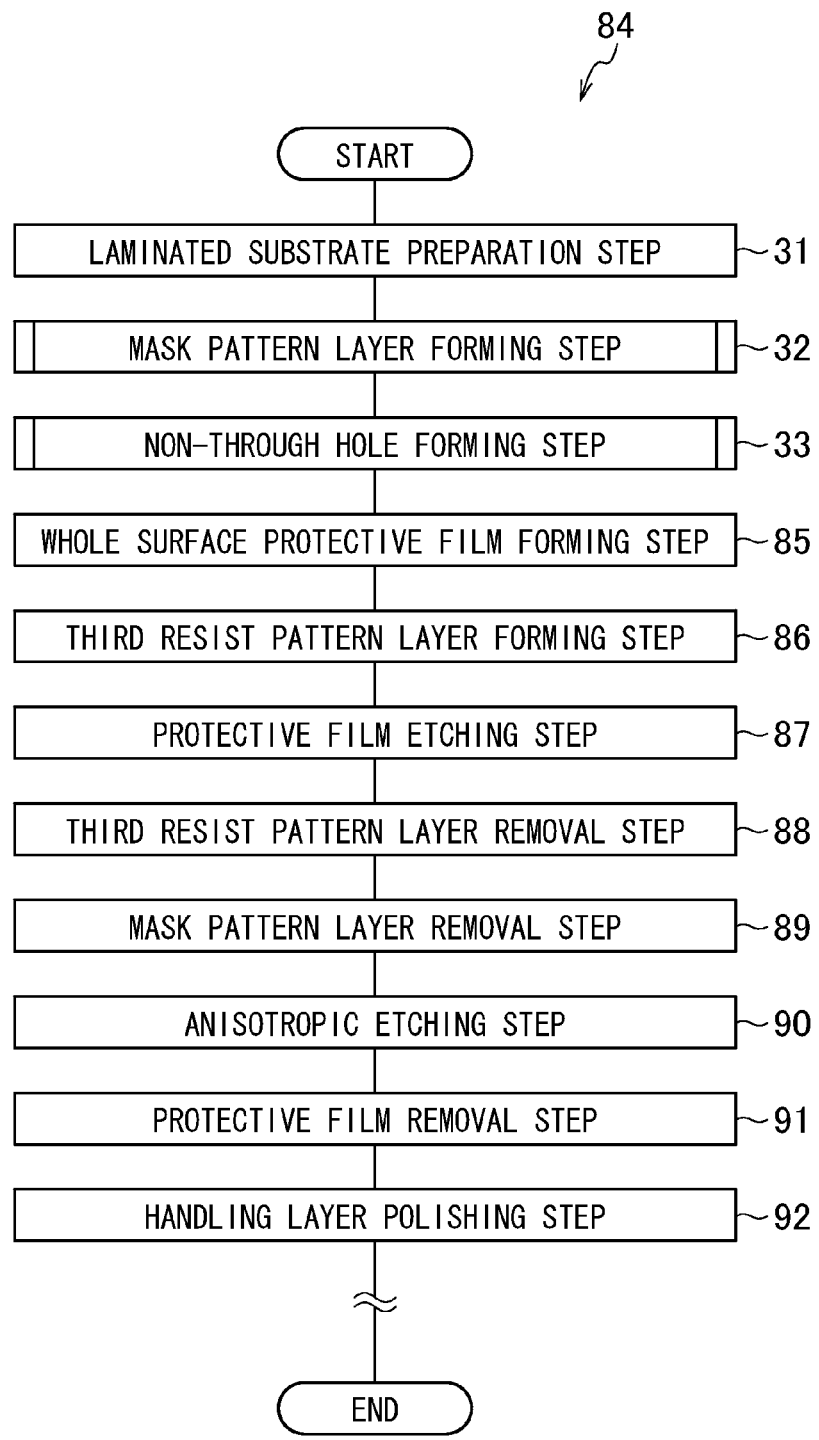
FIG. 27 is a flow chart of the inkjet head manufacturing procedure according to the second embodiment.

As shown in FIG. 27, the head manufacturing procedure 84 involves sequentially carrying out the following steps: the laminated substrate preparation step 31, the mask pattern layer forming step 32, the non-through hole forming step 33, a whole surface protective film forming step 85, a third resist pattern layer forming step 86, a protective film etching step 87, a third resist pattern layer removal step 88, a mask pattern layer removal step 89, an anisotropic etching step 90, a protective film removal step 91 and a handling layer polishing step 92. The steps from the whole surface protective film forming step 85 to the third resist pattern layer removal step 88 correspond to the protective film forming step according to the present invention. Furthermore, the handling layer polishing step 92 corresponds to the opening exposure step according to the present invention.

<Laminated Substrate Preparation Step to Non-Through Hole Forming Step>

The steps from the laminated substrate preparation step 31 to the non-through hole forming step 33 are basically the same as the first embodiment described with reference to FIGS. 2 to 13, and therefore specific description thereof is not give here. However, in the head manufacturing procedure 84, a SOI substrate 48 having a handling layer 82 that has both planar surfaces along (110) crystal planes, instead of the handling layer 50, is used. As shown in FIG. 13, the mask pattern layer 60a and the non-through hole 70 are formed on the laminated substrate 53.

<Whole Surface Protective Film Forming Step>

Figure 28:
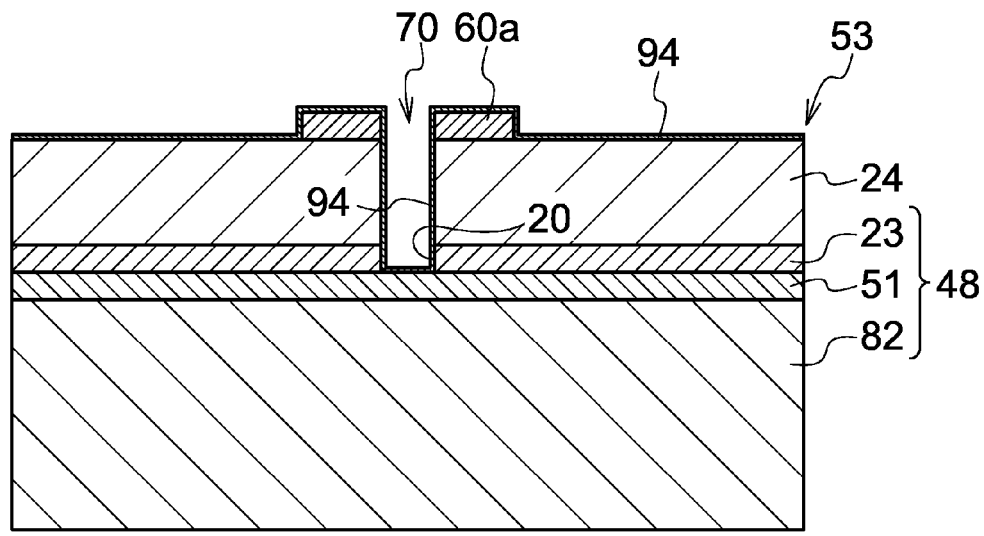
FIG. 28 is an illustrative diagram for describing a whole surface protective film forming step.

In the whole surface protective film forming step 85, a protective film 94 is formed over the whole surface of the second active layer 24 and the mask pattern layer 60a, including the interior of the non-through hole 70, as shown in FIG. 28. The protective film 94 can be made from a-Si, Poly-Si, SiN, SiC, $Al_2O_3$, Al, Cu, and the like, and the protective film 94 in the present embodiment is made from SiN. The SiN film or protective film 94 is formed by sputtering, vapor deposition (e.g., CVD), and the like.

For example, if the SiN film or protective film 94 is formed using the thermal CVD method, then the SiN film is generated by thermal reaction between $SiH_2Cl_2$ (dichlorosilane) and $NH_3$ (ammonia). The reaction pressure in this case is set to 20 Pa to 200 Pa, and the heating temperature is set to 650° C. to 800° C. The thickness of the protective film 94 is adjusted to approximately 0.1 μm to 5.0 μm, and is set to 0.5 μm in the present embodiment. The reason for making the protective film 94 from SiN is because a portion of the box layer 51 ($SiO_2$ film) is removed using HF gas, or the like, in a subsequent stage, and therefore it is necessary to choose the protective film made of a material other than $SiO_2$. Apart from the SiN film, it is also possible to use a material that has resistance to an etchant to be used in removing the box layer 51 ($SiO_2$ film).

<Third Resist Pattern Layer Forming Step>

Figure 29:
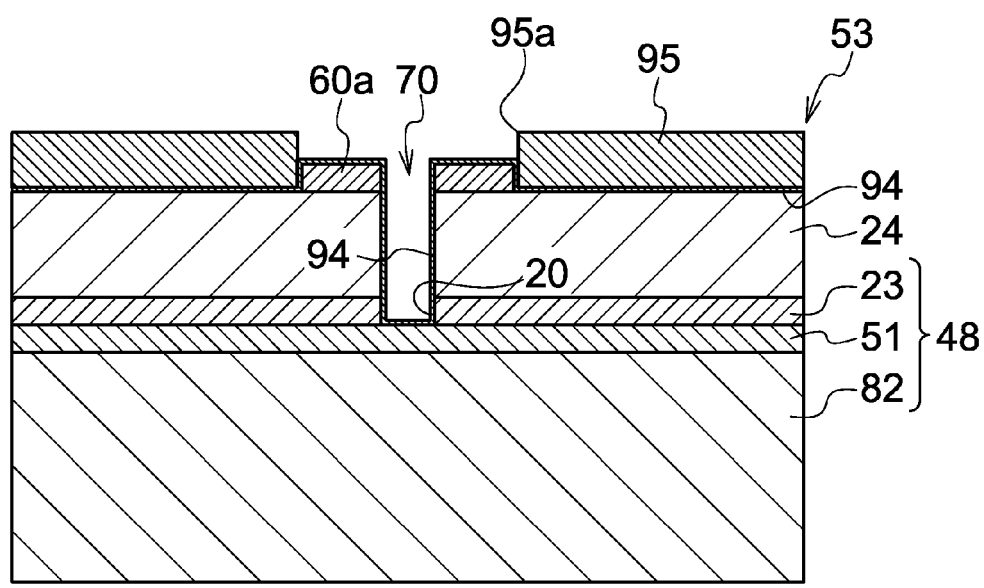
FIG. 29 is an illustrative diagram for describing a third resist pattern layer forming step.

In the third resist pattern layer forming step 86, a third resist pattern layer 95 is formed to cover the protective film 94 formed over the unmasked portion 24a of the second active layer 24 (see FIG. 13), as shown in FIG. 29. The third resist pattern layer 95 has a third resist opening section 95a, which exposes the protective film 94 formed over the mask pattern layer 60a and the protective film 94 formed inside the non-through hole 70. The third resist pattern layer 95 is formed by a similar method to the first resist pattern layer 62 in the first embodiment (a resist layer forming step, a photolithography step, and so on), for example.

<Protective Film Etching Step>

Figure 30:
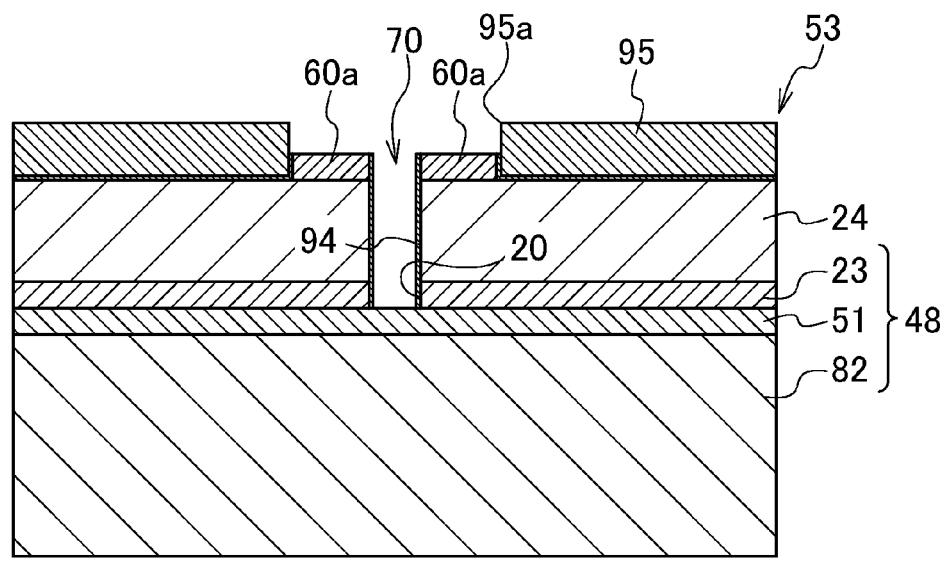
FIG. 30 is an illustrative diagram for describing a protective film etching step.

In the protective film etching step 87, a dry etching process is carried out on the protective film 84 by a commonly known dry etching apparatus, using the third resist pattern layer 95 as the mask, as shown in FIG. 30. A fluoric gas, for example, is used in the dry etching process. Consequently, the protective film 94 over the mask pattern layer 60a and the protective film 94 in the bottom surface of the non-through hole 70 are removed selectively. Thereby, the mask pattern layer 60a and the box layer 51 situated in the bottom section of the non-through hole 70 are exposed.

In so-called anisotropic etching, such as the dry etching, the protective film 94 formed over the inner side surfaces of the non-through hole 70 is not removed. Furthermore, anisotropic etching of various types other than the dry etching can be carried out.

<Third Resist Pattern Layer Removal Step>

Figure 31:
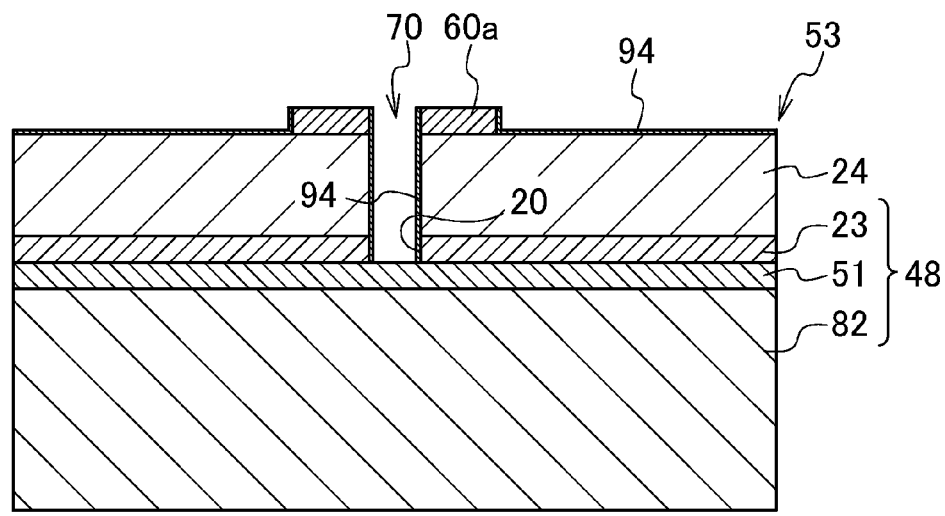
FIG. 31 is an illustrative diagram for describing a third resist pattern layer removal step.

In the third resist pattern layer removal step 88, the third resist pattern layer 95 is removed from the protective film 94 as shown in FIG. 31 by ashing or using a special remover solution. Consequently, the state is achieved where the unmasked portion 24a (see FIG. 13) of the second active layer 24 and the inner side surfaces of the non-through hole 70 are covered with the protective film 94. Therefore, although the type of the protective film covering the unmasked portion 24a and the inner side surfaces of the non-through hole 70 differs, the same state is achieved as that after the completion of the thermal oxide film forming step 34 shown in FIG. 14.

<Mask Pattern Layer Removal Step>

In the mask pattern layer removal step 89, the mask pattern layer 60a over the second active layer 24 is wet etched or vapor etched by a wet etching apparatus or an HF vapor etching apparatus using HF or BHF, and employing the protective film 94 as the mask. Various isotropic etching methods other than the wet etching or vapor etching can be used.

Figure 32:
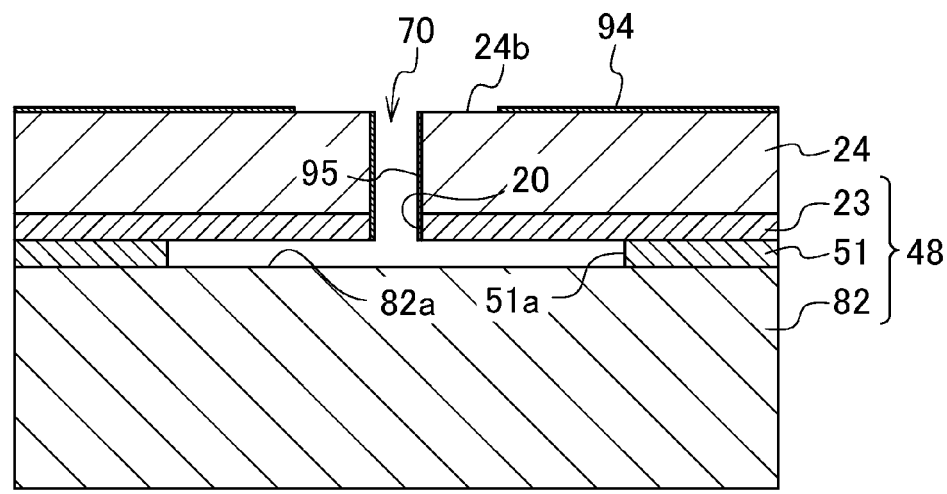
FIG. 32 is an illustrative diagram for describing a mask pattern layer removal step.

As shown in FIG. 32, the mask pattern layer 60a is removed from the second active layer 24 by the wet etching or vapor etching to form the exposed portion 24b over the second active layer 24, similarly to the first embodiment. The unmasked portion 24a (see FIG. 13) of the second active layer 24 is not etched due to be being protected by the protective film 94.

Furthermore, in the mask pattern layer removal step 89, simultaneously with the removal of the mask pattern layer 60a, the box layer 51 exposed in the bottom section of the non-through hole 70 is wet etched or vapor etched via the non-through hole 70. In this case, the inner side surfaces of the non-through hole 70 are not etched due to being masked by the protective film 94. Since the wet etching and the vapor etching are so-called isotropic etching processes, then a circular hole-shaped box layer opening section (third opening section) 51a is formed in the box layer 51, coaxially with the non-through hole 70.

The size (opening diameter) of the box layer opening section 51a increases as the etching duration of the wet etching or vapor etching increases. Therefore, when the wet etching or vapor etching is carried out, the exposed portion of the box layer 51 that is exposed at the bottom section of the non-through hole 70 is firstly removed, and then the peripheral portion of the exposed portion is removed. Consequently, a portion of a surface 82a of the handling layer 82 which is adjacent to the box layer 51 is exposed inside the box layer opening section 51a (below the non-through hole 70).

In this case, the opening diameter of the box layer opening section 51a specifies the size of the opening of the counterbore 83, which is formed in the anisotropic etching 90 described below. Therefore, the wet etching or vapor etching process is terminated by previously determining a relationship between the etching duration and the etching amount of the wet etching or vapor etching process, and specifying the etching duration corresponding to the size of the opening of the counterbore 83 to be formed, in accordance with the determined relationship. The etching amount can be measured by observing the laminated substrate 53 with an infrared (IR) microscope, for example.

<Anisotropic Etching Step>

Figure 33:
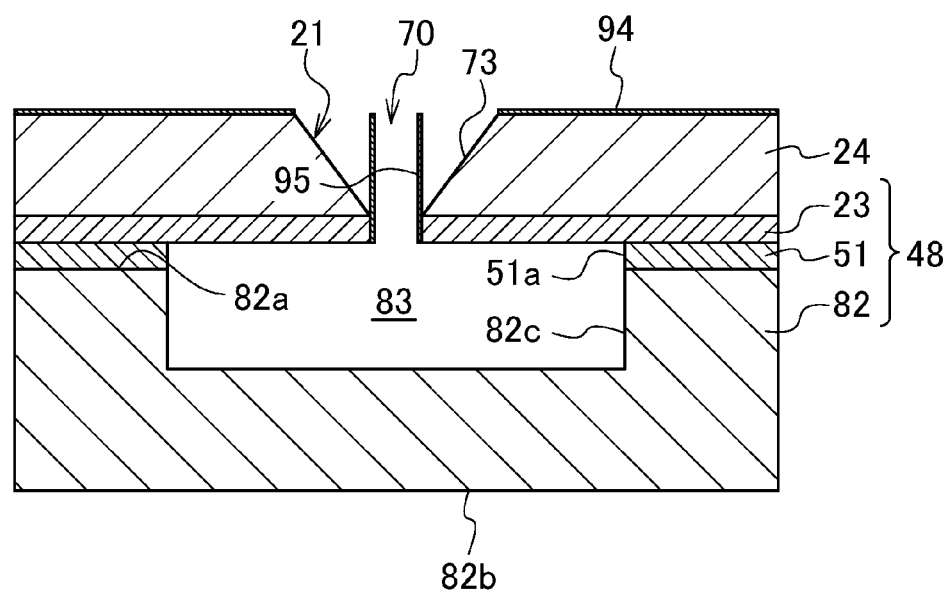
FIG. 33 is an illustrative diagram for describing an anisotropic etching step.

In the anisotropic etching step 90, the second active layer 24 is anisotropically etched by a wet etching apparatus, using the protective film 94 as the mask, as shown in FIG. 33. Similarly to the first embodiment, the approximately quadrilateral pyramid-shaped tapered section 21 defined with the four {111} surfaces 73 (see FIG. 18) is formed by the anisotropic etching of the second active layer 24 with the etching solution from the exposed portion 24b toward the first active layer 23.

Moreover, in the anisotropic etching step 90, the handling layer 82 which is exposed inside the box layer opening section 51a is anisotropically etched via the non-through hole 70 and the box layer opening section 51a. More specifically, the handling layer 82 is anisotropically etched by the etching solution from a portion of the upper surface 82a (see FIG. 32) toward the other surface 82b, which is on the reverse side of the handling layer 82 from the upper surface 82a. In this case, since the handling layer 82 has the (110) surface orientation, then four {111} surfaces 82c are exposed in the handling layer 82 by the anisotropic etching. Consequently, the quadrilateral hole-shaped counterbore 83, which is defined with the four {111} surfaces 82c, is formed in the upper surface 82a side of the handling layer 82. It is possible to suitably adjust the depth of the counterbore 83, by adjusting the etching duration of the anisotropic etching.

<Protective Film Removal Step>

Figure 34:
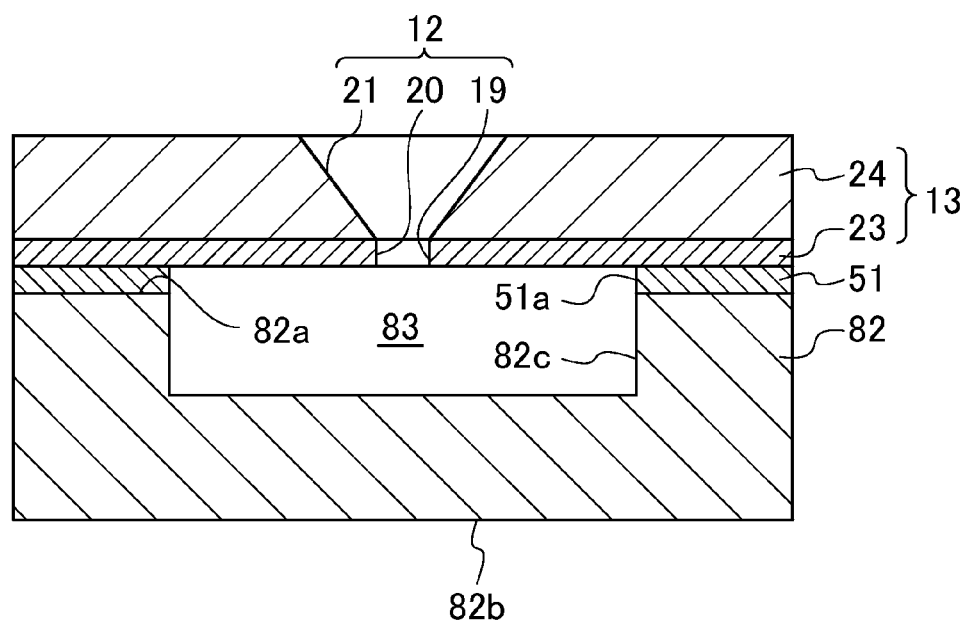
FIG. 34 is an illustrative diagram for describing a protective film removal step.

In the protective film removal step 91, the protective film 94 is removed from the laminated substrate 53 as shown in FIG. 34, by carrying out wet etching (e.g., using hot phosphoric acid), or the like. Consequently, the nozzle plate 13 is formed in the state of being laminated over the handling layer 50 and the box layer 51. The nozzles 12 each having the straight sections 20 and the tapered sections 21 are formed in the nozzle plate 13 by the respective steps described above.

<Handling Layer Polishing Step>

Figure 35:
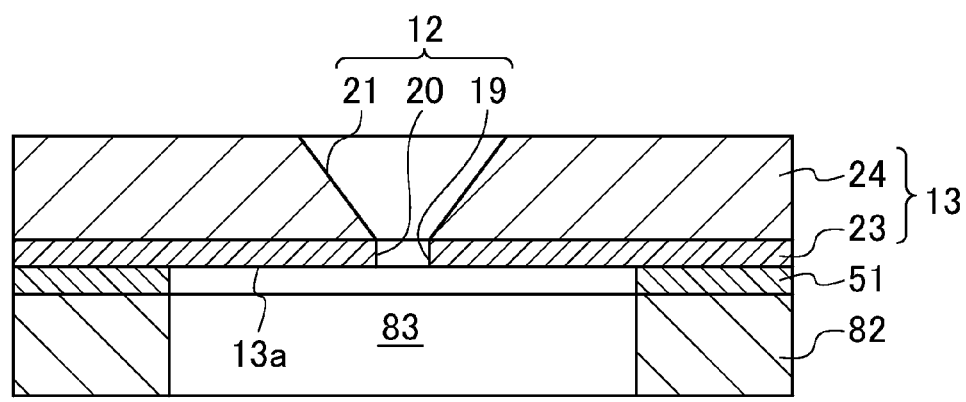
FIG. 35 is an illustrative diagram for describing a handling layer polishing step.

In the handling layer polishing step 92, the counterbore 83 is exposed as shown in FIG. 35, by polishing the handling layer 82 from the surface 82b side. Consequently, the nozzle surface 13a of the nozzle plate 13 and the nozzle openings 19 of the respective nozzles 12 are exposed. It is also possible to grind rather than polish the surface 82b of the handling layer 82, or to apply dry etching.

<Other Processing Steps>

Thereafter, although not shown in the drawings, the flow channel substrate attachment step 38 and the piezoelectric element forming step 39, and the like, are carried out, as described in relation to the first embodiment are carried out. With the foregoing, all of the steps in the head manufacturing procedure 84 are completed, and the inkjet head 80 is completed.

<Beneficial Effects of Inkjet Head Manufacturing Procedure According to Second Embodiment>

The head manufacturing procedure 84 described above is basically the same as the head manufacturing procedure 30 according to the first embodiment, apart from the fact that the method of masking the unmasked portion 24a of the second active layer 24 and the inner side surfaces of the non-through hole 70 is different and the fact that the counterbores 83 are formed in the nozzle plate 13. Therefore, similar beneficial effects to those described in relation to the first embodiment above are obtained.

Furthermore, by forming the counterbores 83 in the nozzle plate 13, when the inkjet head 80 is installed in an inkjet recording apparatus and an image is recorded on recording paper, then even if a recording paper conveyance defect (jamming, etc.) occurs and the recording paper comes into contact with the inkjet head 80, this recording paper is prevented from making direct contact with the nozzle surface 13a of the nozzle plate 13. Hence, it is possible to prevent detachment of the various films, such as the liquid repellent film 25, formed on the nozzle surface 13a, and destruction of the nozzles 12.

General Composition of Inkjet Recording Apparatus

Figure 36:
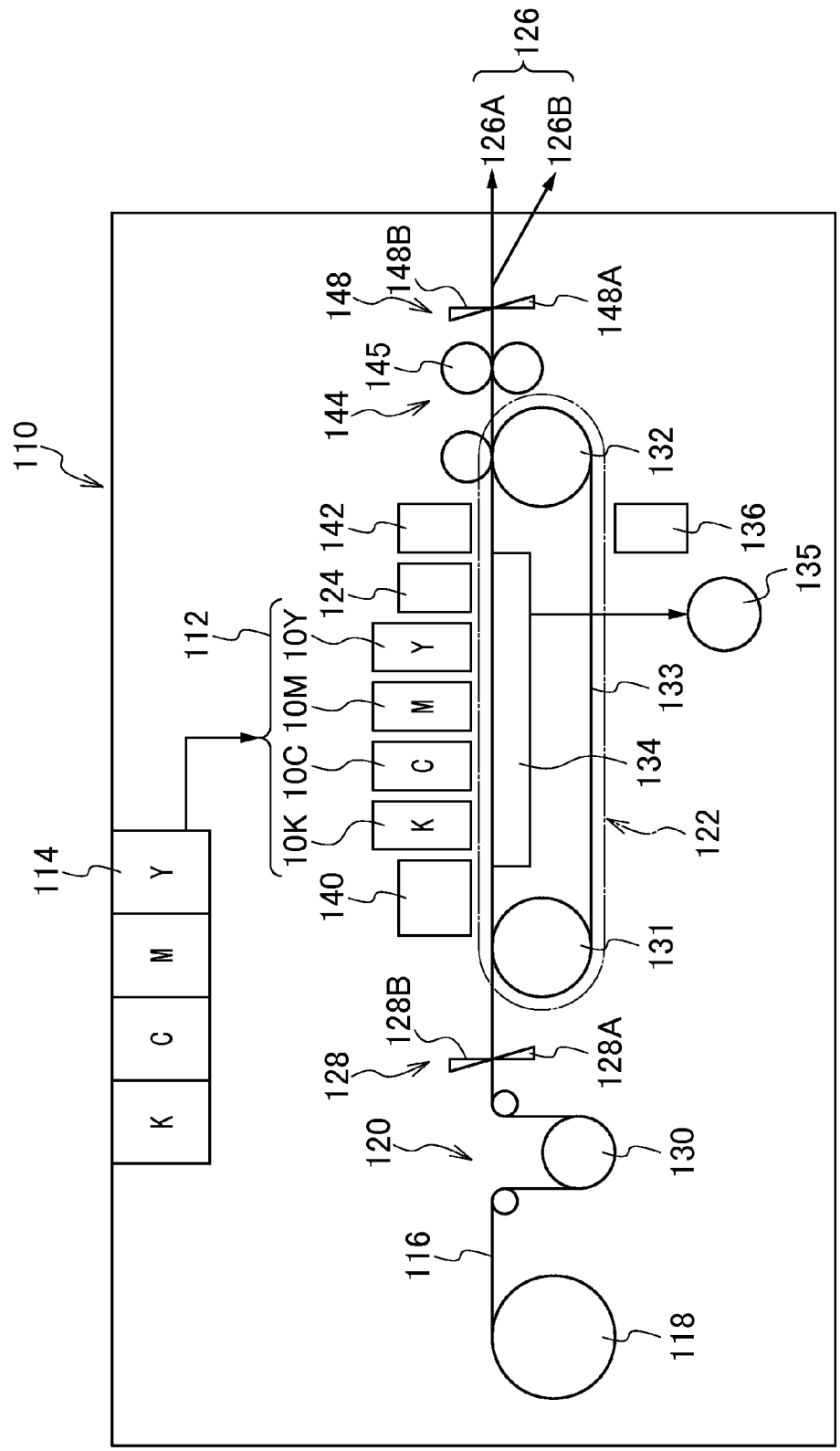
FIG. 36 is a schematic drawing of an inkjet recording apparatus.

FIG. 36 is a general schematic drawing showing an overview of an inkjet recording apparatus 110 including the inkjet head 10 (or the inkjet head 80) having the nozzle plate 13 manufactured by the manufacturing method according to the present invention. As shown in FIG. 36, the inkjet recording apparatus 110 includes: a print unit 112 having a plurality of inkjet heads 10K, 10C, 10M and 10Y, each of which corresponds to the inkjet head 10 or 80 described above) and is provided to correspond to each of colors of inks; an ink storing and loading unit 114, which stores the inks to be supplied to the inkjet heads (hereinafter referred simply to as "heads") 10K, 10C, 10M and 10Y; a paper supply unit 118, which supplies recording paper 116; a decurling unit 120, which removes curl from the recording paper 116; a suction belt conveyance unit 122, which is disposed so as to oppose the nozzle surfaces (the ink ejection surfaces) of the heads 10K, 10C and 10Y, and conveys recording paper 116 while keeping the recording paper 116 flat; a print determination unit 124, which reads out the print results of the print unit 112; and a paper output unit 126, which outputs printed recording paper (a printed object) to the exterior of the inkjet recording apparatus 110.

In FIG. 36, a magazine for rolled paper (continuous paper) is shown as an example of the paper supply unit 118; however, a plurality of magazines with papers of different paper width and quality can be jointly provided. Moreover, papers can be supplied in cassettes that contain cut papers loaded in layers and that are used jointly or in lieu of magazines for rolled papers.

If the roll paper is used, the roll paper is cut to a desired size by a shearing cutter 128. The cutter 128 is constituted of a fixed blade 128A having a length not shorter than the width of the conveyance path of the recording paper 116, and a circular blade 128B, which moves along the fixed blade 128A. If using cut paper, the cutter 128 is not necessary.

The recording paper 116 delivered from the paper supply unit 118 retains curl due to having been loaded in the magazine. In order to remove the curl, heat is applied to the recording paper 116 in the decurling unit 120 by a heating drum 130 in the direction opposite to the curl direction in the magazine. At this time, the heating temperature is preferably controlled in such a manner that the recording paper 116 has a curl in which the surface on which the print is to be made is slightly rounded in the outward direction.

After the decurling, the cut recording paper 116 is delivered to the suction belt conveyance unit 122. The suction belt conveyance unit 122 has a configuration in which an endless belt 133 is set around rollers 131 and 132 so that the portion of the endless belt 133 forms a plane facing at least the nozzle faces of the heads 10K, 10C, 10M and 10Y, and the sensor face of the print determination unit 124.

The belt 133 has a width that is greater than the width of the recording paper 116, and a plurality of suction apertures (not shown) are formed on the belt surface. A suction chamber 134 is disposed in a position facing the sensor surface of the print determination unit 124 and the nozzle surface of the printing unit 112 on the interior side of the belt 133, which is set around the rollers 131 and 132. A negative pressure is generated by sucking air from the suction chamber 134 by means of a fan 135, thereby the recording paper 116 on the belt 133 is held by suction.

By transmitting motive power from a motor 188 (see FIG. 40) to at least one of the rollers 131 and 132 about which the belt 133 is wrapped, the belt 133 is driven in the clockwise direction in FIG. 36. Consequently, the recording paper 116 held on the belt 133 is conveyed from the left-hand side to the right-hand side in FIG. 36.

Since the ink adheres to the belt 133 when a marginless print job or the like is performed, a belt-cleaning unit 136 is disposed in a predetermined position (a suitable position outside the printing area) on the exterior side of the belt 133. Although the details of the configuration of the belt-cleaning unit 136 are not shown, examples thereof include a configuration in which the belt 133 is nipped with a brush roller and a water absorbent roller, an air blow configuration in which clean air is blown onto the belt 133, or a combination of these. In the case of the configuration in which the belt 133 is nipped with the cleaning roller, it is preferable to make the linear velocity of the cleaning roller different from that of the belt 133, in order to improve the cleaning effect.

Instead of the suction belt conveyance unit 122, it is also possible to use a roller nip conveyance mechanism; however, since the printing area passes through the roller nip, the printed surface of the paper makes contact with the rollers immediately after printing, and hence smearing of the image is liable to occur. Therefore, the suction belt conveyance mechanism in which nothing comes into contact with the image surface in the printing area is preferable.

A heating fan 140 is arranged on the upstream side of the print unit 112 in the paper conveyance path formed by the suction belt conveyance unit 122. The heating fan 140 blows heated air onto the recording paper 116 before printing, and thereby heats up the recording paper 116. By heating the recording paper 116 before the printing means, the ink can dry more readily after landing on recording paper 116.

Figure 37:
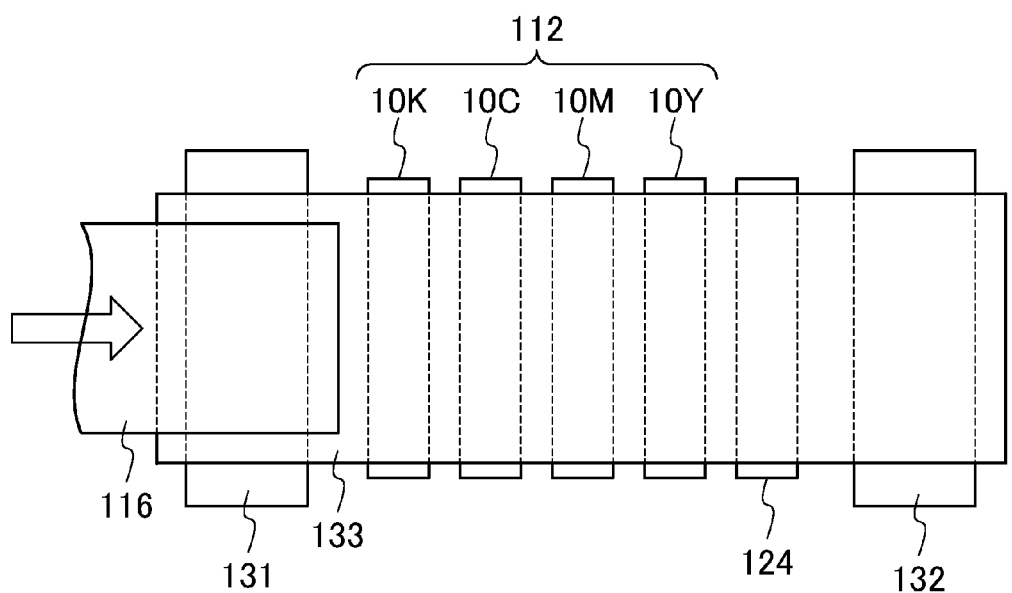
FIG. 37 is an illustrative diagram of a print unit as viewed from the upper surface side.

As shown in FIG. 37, the print unit 112 has so-called full line type heads in which the line heads having a length corresponding to the maximum paper width is arranged in a direction (main scanning direction) that is perpendicular to the paper feed direction (sub-scanning direction). The heads 10K, 10C, 10M and 10Y constituting the print unit 112 are composed of the line heads in which a plurality of ink ejection ports (nozzles) are arranged through a length exceeding at least one edge of the maximum size recording medium 116 intended for use with the inkjet recording apparatus 110.

The heads 10K, 10C, 10M and 10Y are arranged in the order of black (K), cyan (C), magenta (M) and yellow (Y) from the upstream side (the left-hand side in FIG. 36), along the feed direction of the recording paper 116. A color image can be formed on the recording paper 116 by ejecting and depositing droplets of the inks from the heads 10K, 10C, 10M and 10Y, respectively, onto the recording paper 116 while conveying the recording paper 116.

The print unit 112, in which the full-line heads covering the entire width of the paper are thus provided for the respective ink colors, can record an image over the entire surface of the recording paper 116 by performing the action of moving the recording paper 116 and the print unit 112 relatively to each other in the sub-scanning direction just once (in other words, by means of a single sub-scan). Higher-speed printing is thereby made possible and productivity can be improved in comparison with a shuttle type head configuration in which a head moves reciprocally in the main scanning direction perpendicular to the conveyance direction of the paper.

Although the configuration with the four standard colors, K, C, M and Y, is described in the present embodiment, the combinations of the ink colors and the number of colors are not limited to these, and light and/or dark inks can be added as required. For example, a configuration is possible in which heads for ejecting light-colored inks such as light cyan and light magenta are added.

Returning to FIG. 36, the ink storing and loading unit 114 has tanks, which store the inks of colors corresponding to the heads 10K, 10C, 10M and 10Y, and the tanks are connected respectively to the heads 10K, 10C, 10M and 10Y through channels (not shown). Furthermore, the ink storing and loading unit 114 has a function for issuing a corresponding report when the remaining amount of ink has become low, and has a function for preventing incorrect loading between colors.

The print determination unit 124 has an image sensor (line sensor, for example) for capturing an image of the ink-droplet deposition result of the printing unit 112, and has a function of checking ejection defects such as clogs of the nozzles from the ink-droplet deposition results evaluated by the image sensor.

The print determination unit 124 of the present embodiment is constituted of the line sensor having rows of photoelectric transducing elements with a width that is at least greater than the ink-droplet ejection width (image recording width) of the heads 10K, 10C, 10M and 10Y. The line sensor has a color separation line CCD sensor including a red (R) sensor row composed of photoelectric transducing elements (pixels) arranged in a line provided with an R filter, a green (G) sensor row with a G filter, and a blue (B) sensor row with a B filter. Instead of the line sensor, it is possible to use an area sensor composed of photoelectric transducing elements which are arranged two-dimensionally.

The print determination unit 124 reads a test pattern image printed by the heads 10K, 10C, 10M and 10Y for the respective colors, and the ejection of each head is determined. The ejection determination includes the presence of the ejection, measurement of the dot size, and measurement of the dot deposition position.

A post drying unit 142 is disposed in a stage after the print determination unit 124. The post drying unit 142 dries the surface of the printed image using a heating fan, or the like. Desirably, contact with the printed surface is avoided until the ink has dried after the printing, and it is preferable for the post drying unit 142 to adopt a system which blows a warm air flow.

A heating/pressurizing unit 144 is disposed following the post-drying unit 142. The heating/pressurizing unit 144 controls the glossiness of the image surface. The heating/pressurizing unit 144 presses the image surface with a pressure roller 145 having a predetermined uneven surface shape while heating the image surface, and transfers the uneven shape to the image surface.

The printed matter generated in this manner is output from the paper output unit 126. The target print (i.e., the result of printing the target image) and the test print are preferably output separately. In the inkjet recording apparatus 110, a sorting device (not shown) is provided for switching the outputting pathways in order to sort the printed matter with the target print and the printed matter with the test print, and to send them to paper output units 126A and 126B, respectively. When the target print and the test print are simultaneously formed in parallel on the same large sheet of paper, the test print portion is cut and separated by a cutter 148. The cutter 148 is disposed directly in front of the paper output unit 126, and is used for cutting the test print portion from the target print portion when a test print has been performed in the blank portion of the target print. The structure of the cutter 148 is the same as the first cutter 128 described above, and has a stationary blade 148A and a round blade 148B.

<Composition of Inkjet Heads>

Next, the structure of the heads is described. The heads 10K, 10C, 10M and 10Y of the respective colors have a common structure, and therefore these heads are represented by a head denoted with reference numeral 150 below.

Figure 38A:
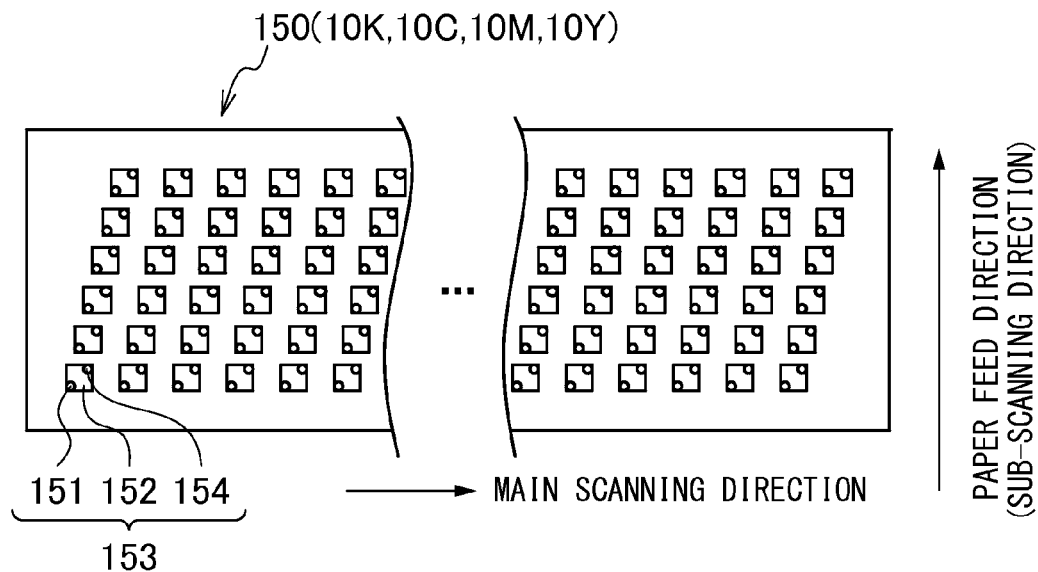
FIGS. 38A to 38C are schematic drawings of nozzle surfaces of the inkjet heads.
Figure 38B:
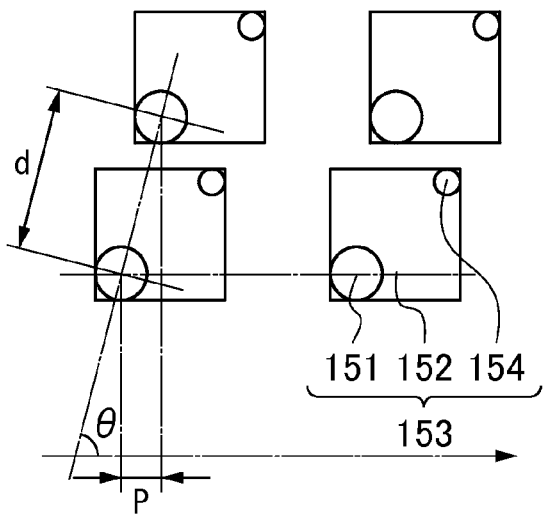
Figure 38C:
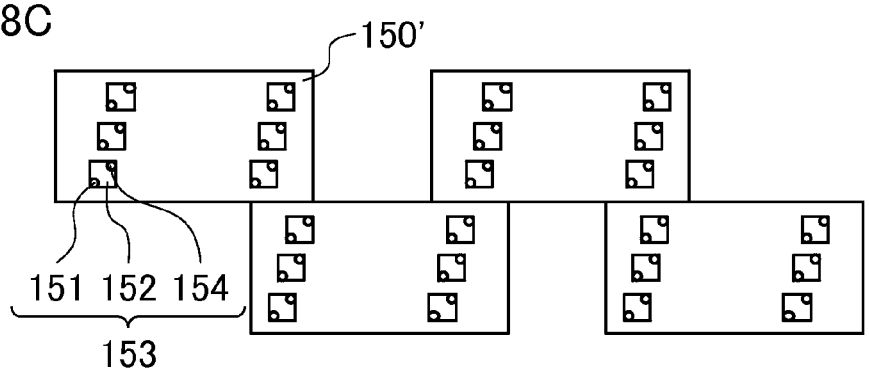

FIG. 38A is a plan view perspective diagram showing an example of the structure of the head 150, and FIG. 38B is a partial enlarged view of same. Furthermore, FIG. 38C is a plan view perspective diagram showing a further example of the structure of the head 150.

In order to achieve a high density of the dots printed onto the surface of the recording paper 116, it is necessary to achieve a high density of the nozzles in the head 150. The head 150 according to the present embodiment has a structure in which a plurality of ink chamber units 153 are arranged (two-dimensionally) in a staggered matrix configuration, each ink chamber unit 153 being constituted of a nozzle 151, which is an ink droplet ejection orifice (corresponding to the nozzle 12 described previously), a pressure chamber 152 corresponding to the nozzle 151 (the pressure chamber 152 corresponds to the pressure chamber 14 described previously), a supply port 154, and so on. Consequently, the effective interval between the nozzles projected to an alignment along the lengthwise direction of the head (the main scanning direction, which is perpendicular to the paper feed direction) (the projected nozzle pitch) is narrowed and a high nozzle density is achieved.

A mode constituting one or more nozzle rows covering a length corresponding to the full width of the recording paper 116 in the main scanning direction, which is substantially perpendicular to the paper feed direction, is not limited to the present example. For example, instead of the composition in FIG. 38A, as shown in FIG. 38C, a line head having nozzle rows of a length corresponding to the full width of the recording paper 116 can be formed by arranging and joining, in a staggered matrix, short head blocks 150' each having a plurality of nozzles 151 arrayed two-dimensionally.

In the present embodiment, the mode is described in which the planar shape of the pressure chambers 152 is a substantially square shape; however, the planar shape of the pressure chambers 152 is not limited to the substantially square shape, and can also adopt various other shapes, such as a substantially circular, a substantially oval shape, a substantially parallelogram shape, a rhombic shape, or the like. Furthermore, the arrangement of the nozzles 151 and the supply ports 154 is not limited to the arrangement shown in FIGS. 38A to 38C, and it is also possible to arrange the nozzle 151 in substantially the central portion of the pressure chamber 152 and to arrange the supply port 154 is a side wall of the pressure chamber 152.

As shown in FIG. 38B, the high-density nozzle head of the present embodiment is achieved by arranging the plurality of ink chamber units in a lattice configuration according to a prescribed arrangement pattern in a row direction following the main scanning direction and an oblique column direction having a prescribed non-perpendicular angle θ with respect to the main scanning direction.

More specifically, by adopting the structure in which the plurality of ink chamber units 153 are arranged at a uniform pitch d in line with the direction forming the angle of θ with respect to the main scanning direction, the pitch P of the nozzles projected to the alignment in the main scanning direction is d×cos θ, and hence it is possible to treat the nozzles 151 as if they were arranged linearly at the uniform pitch of P. By means of this composition, it is possible to achieve the high-density nozzle configuration, in which the nozzle column projected to the alignment in the main scanning direction has the density of 2,400 nozzles per inch.

When implementing the present invention, the arrangement structure of the nozzles is not limited to the example shown in the drawings, and it is also possible to apply various other types of nozzle arrangements, such as an arrangement structure having one nozzle row in the sub-scanning direction, or a structure having nozzle rows arranged in a two-row staggered configuration.

When driving the nozzles by the full-line head having the rows of nozzles of the length corresponding to the entire printable width, the "main scanning" is defined as to print a line (a line formed of a row of dots, or a line formed of a plurality of rows of dots) in the breadthways direction of the recording medium (the main scanning direction) by driving the nozzles in one of the following ways: (1) simultaneously driving all the nozzles; (2) sequentially driving the nozzles from one side toward the other; and (3) dividing the nozzles into blocks and sequentially driving the blocks of the nozzles from one side toward the other.

In particular, when driving the nozzles 151 which are arranged in the matrix configuration as shown in FIGS. 38A to 38C, the main scanning such as that described in (3) above is desirable.

On the other hand, the "sub-scanning" is defined as to repeatedly perform printing of a line (a line formed of a row of dots, or a line formed of a plurality of rows of dots) formed by the main scanning, while moving the full-line head and the recording paper 116 relatively to each other.

In the present embodiment, the full line head is shown, but the range of application of the present invention is not limited to this and the invention can also be applied to a serial type of head which carries out printing in a width direction of recording paper 116 by scanning, in the width direction of the recording paper 116, with a short head having nozzle rows of a length shorter than the width of the recording paper 116.

As shown in FIGS. 38A to 38C, the pressure chambers 152, which are provided to correspond to the nozzles 151, are formed with a substantially square planar shape and the nozzle 151 and the supply port 154 are formed in the respective corner portions on a diagonal of this planar shape. Each of the pressure chambers 152 is connected to a common flow channel or common liquid chamber (not shown). The common flow channel is connected to an ink supply tank (not shown). The ink supplied from the ink supply tank is distributed and supplied to the pressure chambers 152 through the common flow channel.

<Ejection Restoration Device>

Figure 39:
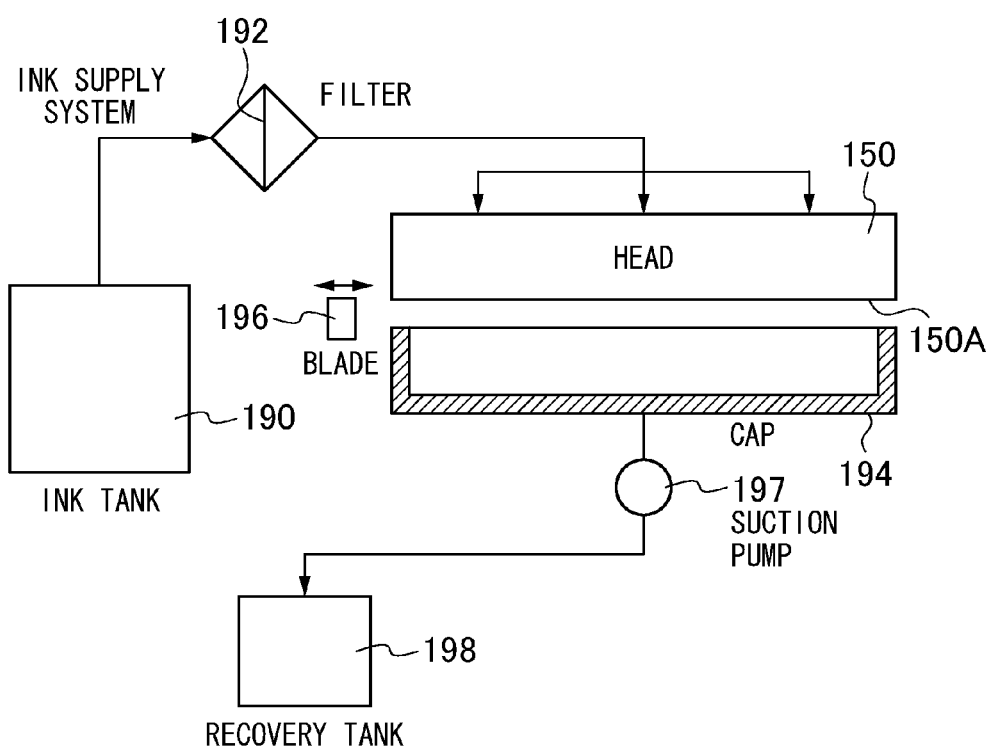
FIG. 39 is a schematic drawing of an ink supply system for the inkjet head.

FIG. 39 is a schematic drawing showing the composition of an ink supply system in the inkjet recording apparatus 110. The ink tank 190 is installed in the ink storing and loading unit 114 shown in FIG. 36 and supplies the ink to the head 150. The ink tank 190 can employ a mode where the ink is replenished through a replenishment port (not shown) when the remaining amount of ink has become low, or a cartridge system where each tank is replaced individually. If the type of ink is changed in accordance with the usage, then a cartridge system is suitable. In this case, desirably, information about the ink type is identified by a barcode, or the like, and ejection is controlled in accordance with the type of ink. The ink tank 190 is equivalent to the ink storing and loading unit 114 in FIG. 36 described above.

A filter 192 for removing foreign matters and bubbles is disposed in the middle of a channel connecting the ink tank 190 and the head 150. The filter mesh size in the filter 192 is preferably equivalent to or less than the diameter of the nozzle of the head 150 and commonly about 20 μm.

Although not shown in FIG. 39, a sub-tank can be provided integrally to the head 150 or nearby the head 150. The sub-tank has a damper function for preventing variation in the internal pressure of the head 150 and a function for improving refilling of the head 150.

Further, the inkjet recording apparatus 110 is provided with a cap 194 for preventing the nozzles from drying or preventing increase in ink viscosity in the vicinity of the nozzles, and a cleaning blade 196 for cleaning the nozzle surface 150A.

A maintenance unit including the cap 194 and the cleaning blade 196 can be relatively moved with respect to the head 150 by a movement mechanism (not shown), and is moved from a predetermined holding position to a maintenance position below the head 150 as required.

The cap 194 is displaced up and down relatively with respect to the head 150 by an elevator mechanism (not shown). When the power is turned off or when in a print standby state, the elevator mechanism raises the cap 194 to a predetermined elevated position so as to come into close contact with the head 150, and the nozzle region of the nozzle surface 150A is thereby covered with the cap 194.

The cleaning blade 196 is made from an elastic member of rubber, or the like, and can be slid over the ink ejection surface of the head 150 (the nozzle surface 150A) by a blade movement mechanism (not shown). If ink droplets or foreign matter have become attached to the nozzle surface 150A, then the nozzle surface 150A is wiped and the nozzle surface 150A is cleaned, by sliding the cleaning blade 196 over the nozzle surface 150A.

During printing or during standby, if the use frequency of a particular nozzle 151 has declined and the ink viscosity in the vicinity of the nozzle 151 has increased, then preliminary ejection is performed toward the cap 194, in order to expel the ink of increased viscosity (degraded ink).

More specifically, if the head 150 continues in a state of not having performed ejection for a certain period of time or longer, then the ink solvent in the vicinity of the nozzles 151 evaporates, the viscosity of the ink in the vicinity of the nozzles 151 rises, and even if the actuators for driving ejection (piezoelectric elements) are operated, the ink is not ejected from the nozzles 151. Therefore, before a state of this kind occurs (while the viscosity of the ink still allows ejection of the ink by operation of the piezoelectric elements), a "preliminary ejection" is carried out to eject the ink in the vicinity of the nozzles 151 of which the viscosity has increased toward an ink receptacle by operating the piezoelectric elements. Furthermore, after cleaning soiling of the nozzle surface 150A with a wiper, such as the cleaning blade 196, preliminary ejection is also carried out in order to prevent foreign matter from entering inside the nozzles 151 due to the wiping action of the wiper. The preliminary ejection is also referred to as "dummy ejection", "purging", "spitting", and so on.

Furthermore, if bubbles enter into the ink inside the head 150 (the ink inside the pressure chambers 152), the cap 194 is placed on the head 150, the ink (ink containing the bubbles) inside the pressure chambers 152 is removed by suction, by means of a suction pump 197, and the ink removed by the suction is then sent to a recovery tank 198. This suction operation is also carried out in order to suck and remove degraded ink having increased viscosity and hardened, when the ink is loaded into the head 150 for the first time, and when the head 150 starts to be used after having been out of use for a long period of time.

More specifically, if bubbles enter inside the nozzles 151 and the pressure chambers 152, or if increase in the viscosity of the ink inside the nozzles 151 exceeds a certain level, then it becomes impossible to eject the ink from the nozzles 151 by preliminary ejection through operating the piezoelectric elements. In cases such as these, an operation is carried out to place the cap 194 on the nozzle surface 150A of the head 150 and to suction the ink of increased viscosity or ink containing bubbles inside the pressure chambers 152, by means of the pump 197.

However, the suction operation described above consumes a large amount of ink since it is performed with respect to all of the ink inside the pressure chambers 152. Therefore, it is desirable to carry out preliminary ejection while the increase in viscosity is small, as far as possible. The cap 194 shown in FIG. 39 can function as the ink receptacle for preliminary ejection, as well as functioning as the suction device.

Furthermore, desirably, the inner side of the cap 194 is divided by partitioning walls into a plurality of areas corresponding to the nozzle rows, in such a manner that each of the divided areas can be sucked selectively, by a selector, or the like.

<Explanation of Control System>

Figure 40:
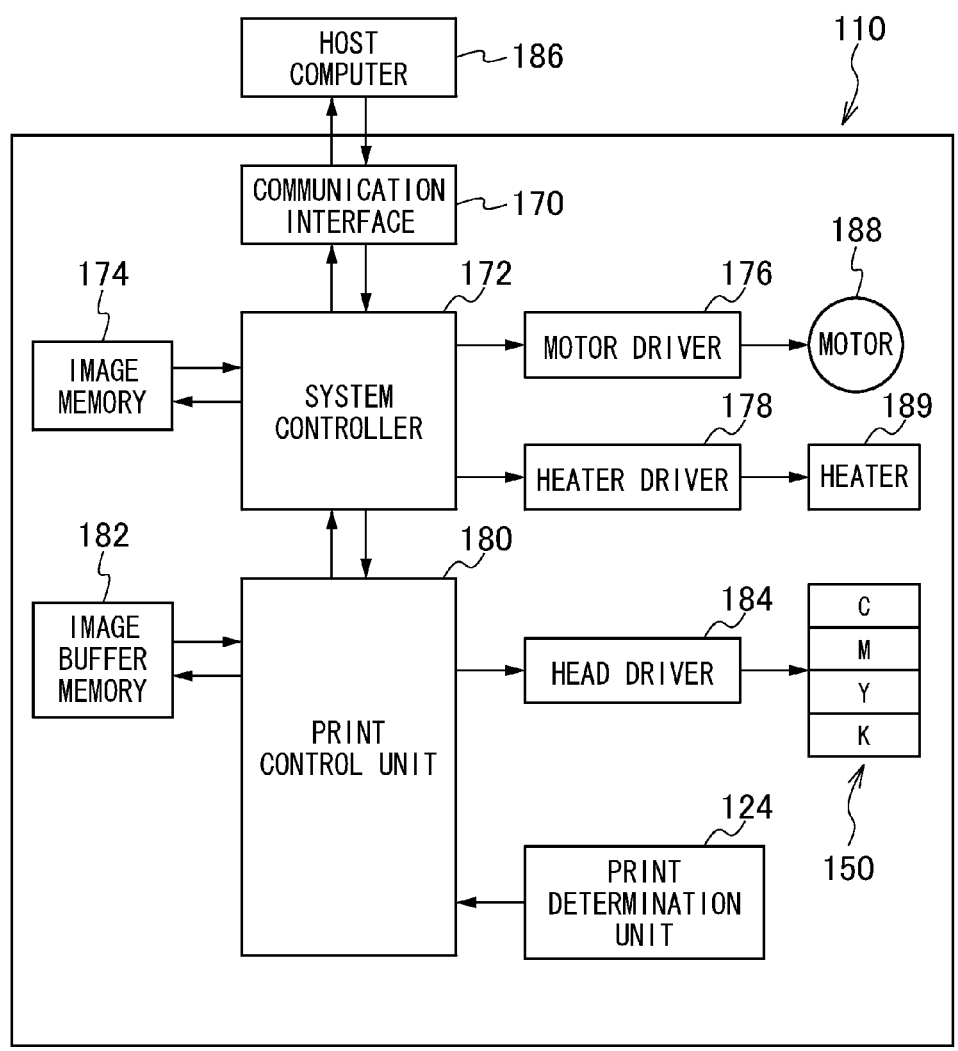
FIG. 40 is a block diagram showing an electrical composition of the inkjet recording apparatus.

FIG. 40 is a principal block diagram showing the system configuration of the inkjet recording apparatus 110. The inkjet recording apparatus 110 has a communication interface 170, a system controller 172, an image memory 174, a motor driver 176, a heater driver 178, a print control unit 180, an image buffer memory 182, a head driver 184, and the like.

The communication interface 170 is an interface unit for receiving image data sent from a host computer 186. A serial interface such as universal serial bus (USB), IEEE1394, Ethernet (tradename), wireless network, or a parallel interface such as a Centronics interface can be used as the communication interface 170. A buffer memory (not shown) can be mounted in this portion in order to increase the communication speed. The image data sent from the host computer 186 is received by the inkjet recording apparatus 110 through the communication interface 170, and is temporarily stored in the memory 174. The memory 174 temporarily stores images inputted through the communication interface 170, and data is written and read to and from this memory 174 through the system controller 172. The memory 174 is not limited to a memory composed of semiconductor elements, and a hard disk drive or another magnetic medium can be used.

The system controller 172 is a control unit for controlling the various sections, such as the communication interface 170, the memory 174, the motor driver 176, the heater driver 178, and the like. The system controller 172 is constituted of a central processing unit (CPU) and peripheral circuits thereof, and the like, and in addition to controlling communications with the host computer 186 and controlling reading and writing from and to the memory 174, or the like, it also generates a control signal for controlling the motor 188 of the conveyance system and the heater 189.

The motor driver 176 is a driver (drive circuit) that drives the motor 188 in accordance with commands from the system controller 172. The heater driver 178 drives the heater 189 of the post-drying unit 142 (shown in FIG. 36) or the like in accordance with commands from the system controller 172.

The print controller 180 has a signal processing function for performing various tasks, compensations, and other types of processing for generating print control signals from the image data stored in the memory 174 in accordance with the control of the system controller 172 so as to supply the generated print control signal to the head driver 184. Prescribed signal processing is carried out in the print controller 180, and the ejection amount and the ejection timing of the ink droplets from the respective heads 150 are controlled (in other words, droplet ejection control is performed) through the head driver 184, on the basis of the print data. By this means, prescribed dot size and dot positions can be achieved.

The print controller 180 is provided with an image buffer memory 182, and image data, data on parameters and the like are temporarily stored in the image buffer memory 182 during image data processing by the print controller 180. Although the configuration in which the image buffer memory 182 is attached to the print controller 180 is shown in FIG. 40, the memory 174 can also serve as the image buffer memory.

The head driver 184 drives the piezoelectric elements of the heads 10K, 10C, 10M and 10Y (or the heads 150) of the respective colors on the basis of the print data supplied by the print controller 180. The head driver 184 can be provided with a feedback control system for maintaining constant drive conditions for the heads.

The print determination unit 124 is a block that includes the line sensor as shown in FIG. 36, reads the image printed on the recording paper 116, determines the print conditions (presence of the ejection, variation in the dot formation, and the like) by performing required signal processing, or the like, and provides the determination results of the print conditions to the print controller 180. According to requirements, the print controller 180 makes various corrections with respect to the head 150 on the basis of information obtained from the print determination unit 124.

The system controller 172 and the print control unit 180 can be constituted by one processor. Furthermore, it is possible to use a device in which the system controller 172, the motor driver 176 and the heater driver 178 are composed as a single unit, and to use a device in which the print control unit 180 and the head driver are composed as a single unit.

<Action and Beneficial Effects of Inkjet Recording Apparatus>

The nozzles 151 (the straight sections 20 and tapered sections 21 of the nozzles 12 described above) in the heads 10K, 10C, 10M and 10Y (or the heads 150) are formed with high precision and since the ejection performance is stable, a recorded image of good quality can be obtained.

<Examples of Application of Apparatus>

In the inkjet heads 10 and 80 according to the respective embodiments described above, ejection pressure (ejection energy) for ejecting droplets from the nozzles is generated by the piezoelectric elements; however, pressure generating elements (ejection energy generating elements) of various types, such as electrostatic actuators, heaters (heating elements) in a thermal method (a method which ejects ink by using the pressure created by film boiling upon heating by the heaters) or actuators of various kinds based on other methods, can be employed. Corresponding energy generating elements are arranged in the flow channel structures in accordance with the ejection method of the heads.

In the embodiment described above, the method of manufacturing the nozzle plate of the inkjet head used in the inkjet recording apparatus for graphic printing has been described; however, the present invention can also be applied to a method of manufacturing a nozzle plate used in inkjet recording apparatuses of various types, which form various shapes or patterns using various liquid functional material, such as a wiring image forming apparatus, which forms an image of a wiring pattern for an electronic circuit, manufacturing apparatuses for devices of various types, resist printing apparatuses, which use resin liquid as a functional liquid for ejection, color filter manufacturing apparatuses, fine structure forming apparatuses, which form a fine structure using a material for material deposition, and so on.

In the embodiments described above, the nozzle plate 13 is manufactured by using the laminated substrate 53 in which the second active layer 24 is laminated over the first active layer 23 of the SOI substrate 48; however, it is also possible to manufacture a nozzle plate using a laminated substrate in which first and second active layers 23 and 24 are laminated on an oxide film, such as an $SiO_2$ film, rather than using the SOI substrate 48.

In the first embodiment described above, the monocrystalline silicon substrate having the (100) surface orientation is used as the handling layer 50; however, the surface orientation of the handling layer 50 is not limited in particular to (100). Moreover, it is also possible to use a material other than silicon for the handling layer 50. However, in this case, desirably, the type and thickness, etc., of the material is selected so as to avoid warping or to reduce warping, or the like, of the laminated substrate in the heat treatment which is carried out in the respective steps of the head manufacturing procedure 30. Moreover, in the various embodiments described above, the $SiO_2$ film is given as an example of the box layer 51; however, it is also possible to use oxide films of various types within a range that does not give rise to warping, or the like, of the laminated substrate in the heat treatment steps.

Furthermore, the present invention is not limited to the various embodiments described above (for example, the forming methods and the etching methods for the respective layers and the respective films, and the like).

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of manufacturing a nozzle plate, comprising:
    a mask pattern layer forming step of, with respect to a laminated substrate having a structure in which a first silicon substrate having a (111) surface orientation and a second silicon substrate having a (100) surface orientation are sequentially laminated on a surface of an oxide film, forming a frame-shaped mask pattern layer on the second silicon substrate, the frame-shaped mask pattern layer having a first opening section at a position where a nozzle is to be formed;
    a non-through hole forming step of forming a straight section of the nozzle in the first silicon substrate by forming a non-through hole that passes from the first opening section through the second silicon substrate and the first silicon substrate to the surface of the oxide film;
    a protective film forming step of forming a protective film over a first portion on the second silicon substrate that is not covered with the framed-shaped mask pattern layer, and over inner surfaces of the first and second silicon substrates defining the non-through hole;
    a mask pattern layer removal step of removing the framed-shaped mask pattern layer from the second silicon substrate and exposing a second portion on the second silicon substrate that has been covered with the framed-shaped mask pattern layer;
    an anisotropic etching step of performing anisotropic etching of the second silicon substrate from the second portion until reaching the first silicon substrate using the protective film as a mask, so as to form a tapered section of the nozzle, the tapered section being defined with {111} surfaces exposed in the second silicon substrate by the anisotropic etching, the tapered section being connected with the straight section and gradually narrowing toward the straight section;

a protective film removal step of removing the protective film; and an opening exposure step of exposing an opening of the straight section at a side of the first silicon substrate adjacent to the oxide film.

2. The method as defined in claim 1, wherein:
in the mask pattern layer forming step, the first opening section is formed in a circular shape; and
in the non-through hole forming step, the straight section is formed in a circular hole shape by forming the non-through hole in a circular hole shape.

3. The method as defined in claim 1, wherein, in the framed-shaped mask pattern layer forming step, an outer shape of the mask pattern layer is formed in a quadrilateral shape.

4. The method as defined in claim 1, wherein a length of the straight section is specified by adjusting a thickness of the first silicon substrate.

5. The method as defined in claim 1, wherein a length of the tapered section is specified by adjusting a thickness of the second silicon substrate.

6. The method as defined in claim 1, wherein, in the anisotropic etching step, the first silicon substrate functions as an etching stopper in the anisotropic etching of the second silicon substrate.

7. The method as defined in claim 1, wherein the mask pattern layer forming step includes:
a mask layer forming step of forming a mask layer over the second silicon substrate;
a first resist pattern layer forming step of forming, over the mask layer, a first resist pattern layer of a shape corresponding to the framed-shaped mask pattern layer at a position corresponding to the position where the nozzle is to be formed;
a mask layer etching step of forming the framed-shaped mask pattern layer by etching the mask layer using the first resist pattern layer as a mask; and
a first resist pattern layer removal step of removing the first resist pattern layer.

8. The method as defined in claim 1, wherein the non-through hole forming step includes:
a second resist pattern layer forming step of forming, over the second silicon substrate and the framed-shaped mask pattern layer, a second resist pattern layer having a second opening section which exposes the first opening section;
a silicon substrate etching step of forming the non-through hole by sequentially etching the second silicon substrate and the first silicon substrate by using the second resist pattern layer as a mask; and
a second resist pattern layer removal step of removing the second resist pattern layer.

9. The method as defined in claim 1, wherein:
the framed-shaped mask pattern layer is made from a material having resistance to thermal oxidization; and
in the protective film forming step, a thermal oxide film as the protective film is formed on the first portion of the second silicon substrate and on the inner surfaces of the first and second silicon substrates defining the non-through hole.

10. The method as defined in claim 1, wherein in the opening exposure step, the opening of the straight section at the side of the first silicon substrate adjacent to the oxide film is exposed by removing the oxide film.

11. The method as defined in claim 1, wherein the protective film forming step includes:
a whole surface protective film forming step of forming the protective film over the first portion of the second silicon substrate, over the framed-shaped mask pattern layer, and over an inner surface of the non-through hole;
a third resist pattern layer forming step of forming a third resist pattern layer which covers the protective film formed on the first portion of the second silicon substrate; and
a protective film etching step of etching and removing the protective film formed on the framed-shaped mask pattern layer and the protective film formed on a bottom section of the non-through hole, by using the third resist pattern layer as a mask.

12. The method as defined in claim 11, wherein:
a third silicon substrate having a (110) surface orientation is arranged on another surface of the oxide film; and
in the mask pattern layer removal step, a third opening section which is coaxial with the non-through hole is formed in the oxide film by etching the oxide film via the non-through hole, so as to expose a portion of a first surface of the third silicon substrate adjacent to the oxide film.

13. The method as defined in claim 12, wherein in the anisotropic etching step, a counterbore is formed in the first surface of the third silicon substrate, by performing the anisotropic etching of the third silicon substrate from a portion of the first surface toward a second surface of the third silicon substrate reverse to the first surface, via the non-through hole and the third opening section.

14. The method as defined in claim 13, wherein in the opening exposure step, the counterbore is exposed by polishing or grinding the third silicon substrate from the second surface.

15. The method as defined in claim 11, wherein the laminated substrate includes an SOI substrate in which the oxide film and the first silicon substrate are laminated sequentially on a third silicon substrate having a (110) surface orientation, and the second silicon substrate which is laminated on the first silicon substrate.

16. The method as defined in claim 1, wherein:
the laminated substrate includes an SOI substrate in which the oxide film and the first silicon substrate are laminated sequentially on a third silicon substrate, and the second silicon substrate which is laminated on the first silicon substrate; and
in the opening exposure step, the third silicon substrate and the oxide film are removed sequentially.

17. The method as defined in claim 1, further comprising a laminated substrate preparation step of preparing the laminated substrate before the mask pattern layer forming step.

* * * * *